(12) United States Patent
Matsunaga

(10) Patent No.: US 10,620,464 B2
(45) Date of Patent: Apr. 14, 2020

(54) DISPLAY DEVICE

(71) Applicant: Japan Display Inc., Tokyo (JP)

(72) Inventor: Ikuo Matsunaga, Tokyo (JP)

(73) Assignee: Japan Display Inc., Tokyo (JP)

( * ) Notice: Subject to any disclaimer, the term of this patent is extended or adjusted under 35 U.S.C. 154(b) by 113 days.

(21) Appl. No.: 15/792,955

(22) Filed: Oct. 25, 2017

(65) Prior Publication Data
US 2018/0136508 A1    May 17, 2018

(30) Foreign Application Priority Data
Nov. 11, 2016    (JP) ................... 2016-220419

(51) Int. Cl.
| | | |
|---|---|---|
| *G02F 1/1333* | (2006.01) | |
| *H01L 27/32* | (2006.01) | |
| *H01L 51/00* | (2006.01) | |
| *H01L 51/52* | (2006.01) | |
| *H01R 12/62* | (2011.01) | |
| *G02F 1/1362* | (2006.01) | |
| *G02F 1/13357* | (2006.01) | |
| *H05K 3/36* | (2006.01) | |

(52) U.S. Cl.
CPC .. *G02F 1/133305* (2013.01); *G02F 1/133345* (2013.01); *H01L 27/3246* (2013.01); *H01L 51/0097* (2013.01); *H01L 51/5203* (2013.01); *H01R 12/62* (2013.01); *G02F 1/133603* (2013.01); *G02F 1/136213* (2013.01); *H01L 2251/5338* (2013.01); *H05K 3/361* (2013.01); *H05K 2201/09145* (2013.01); *Y02E 10/549* (2013.01)

(58) Field of Classification Search
CPC ..................... G02F 1/133305; G02F 1/133345
See application file for complete search history.

(56) References Cited

U.S. PATENT DOCUMENTS

| | | | | |
|---|---|---|---|---|
| 8,368,861 B2 * | 2/2013 | Niioka | ............... | G02F 1/133555 349/114 |
| 2007/0002226 A1 * | 1/2007 | Sakamoto | ......... | G02F 1/133555 349/114 |
| 2007/0268431 A1 * | 11/2007 | Shin | .................. | G02F 1/133555 349/114 |

FOREIGN PATENT DOCUMENTS

JP    2011-183916 A    9/2011

* cited by examiner

*Primary Examiner* — Dung T Nguyen
(74) *Attorney, Agent, or Firm* — Michael Best & Friedrich LLP

(57) ABSTRACT

A display device includes a base film including a first region and a plurality of second regions having the first region therebetween; an inorganic insulating film on the base film, the inorganic insulating film being in contact with the plurality of second regions of the base film; a plurality of first pixels overlapping the first region; and a plurality of second pixels overlapping the plurality of second regions with the inorganic insulating film being between the plurality of second pixels and the plurality of second regions. The inorganic insulating film is divided by the first region and is discontinuous between the plurality of second regions.

12 Claims, 36 Drawing Sheets

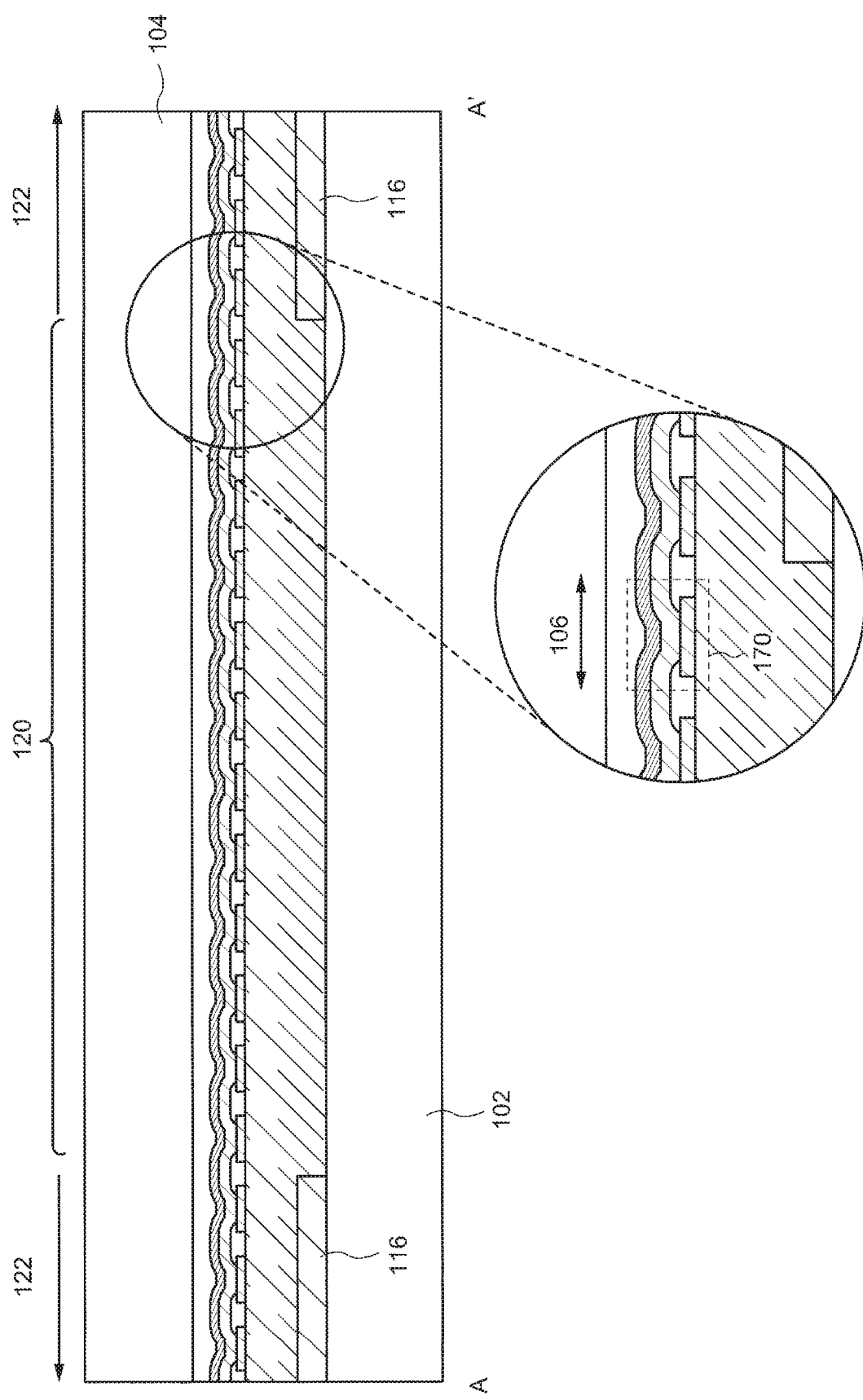

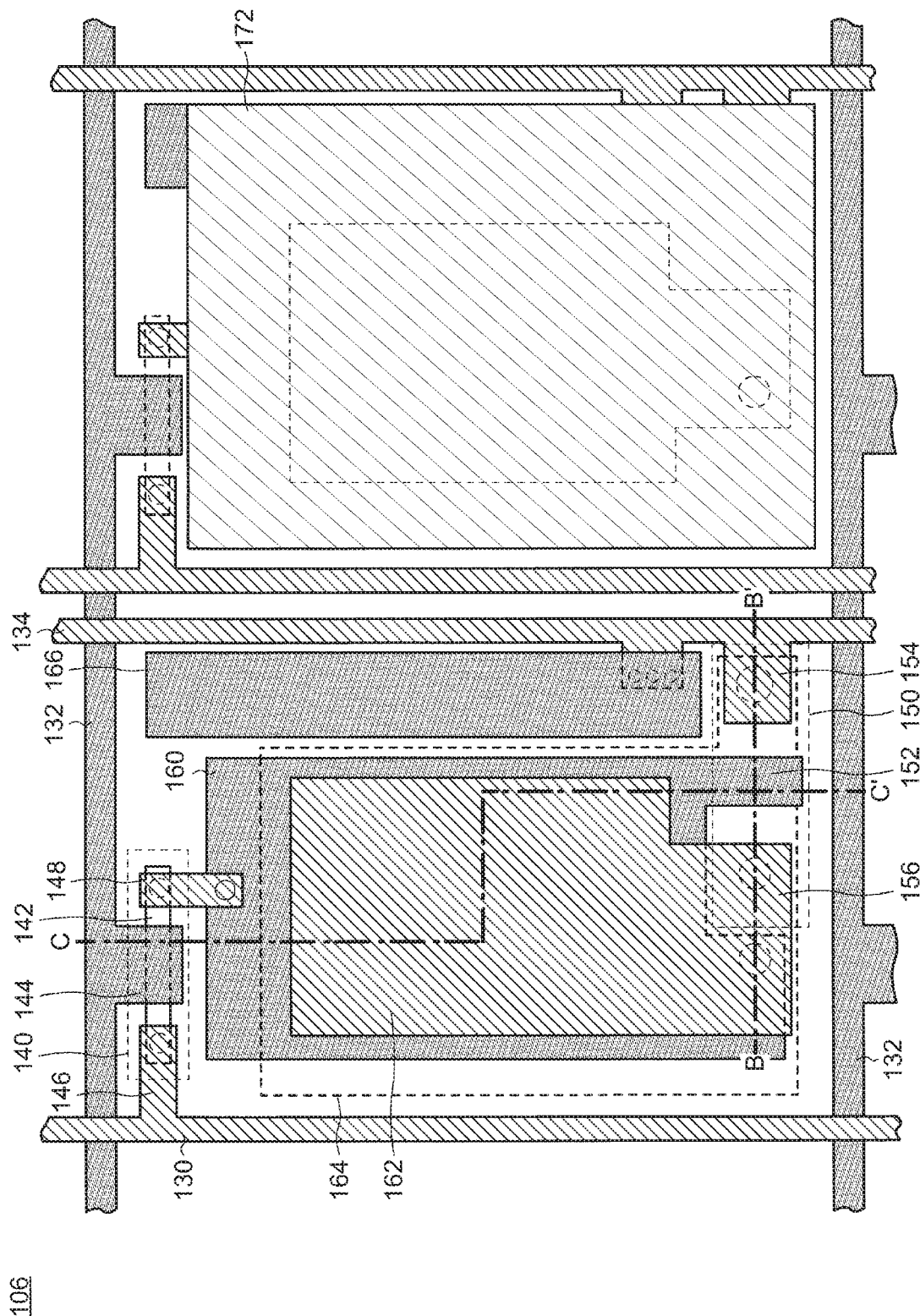

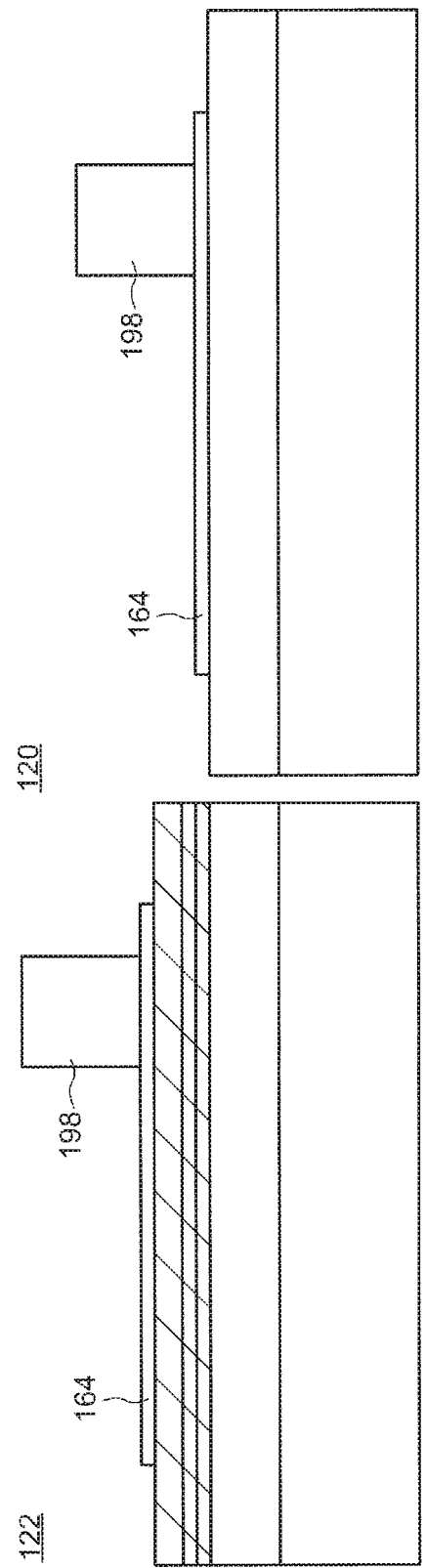

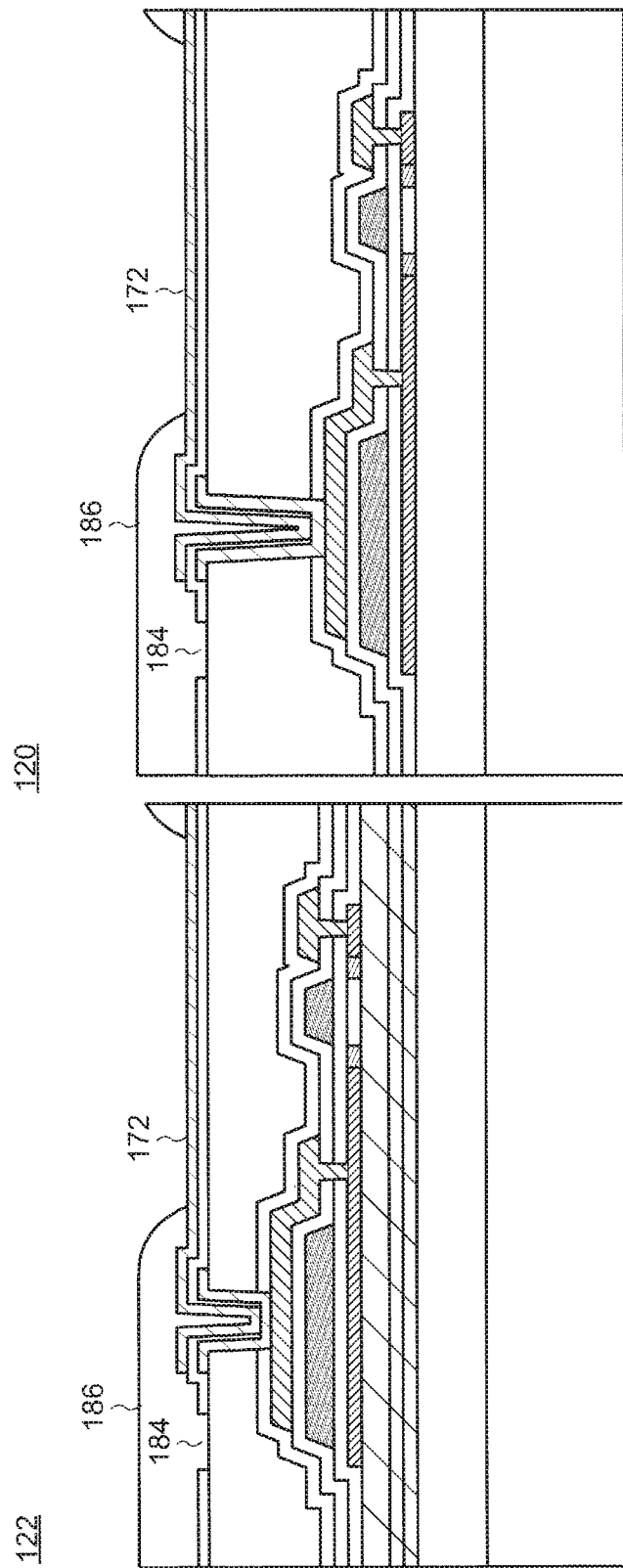

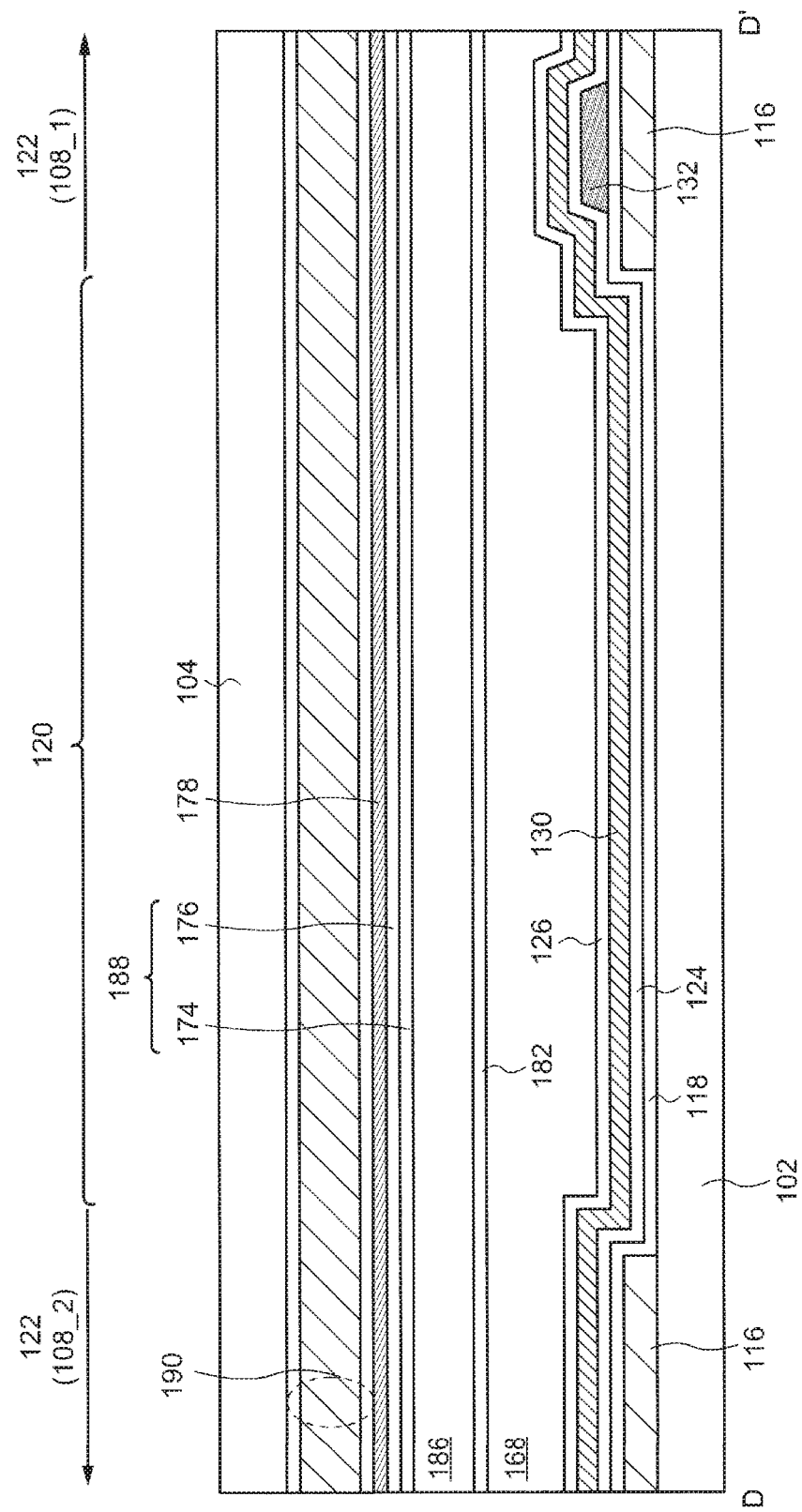

DISPLAY DEVICE

CROSS REFERENCE TO RELATED APPLICATIONS

This application is based upon and claims the benefit of priority from the prior Japanese Patent Application No. 2016-220419, filed on Nov. 11, 2016, the entire contents of which are incorporated herein by reference.

FIELD

One of embodiments of present invention relates to a display device such as an organic EL display device, a liquid crystal display device or the like, and a method for producing the same, for example, a flexible display device and a method for producing the same.

BACKGROUND

Representative display devices include a liquid crystal display device including a liquid crystal element in each of pixels, an organic EL (electroluminescence) display device including a light emitting element in each of pixels, and the like. These display devices each include a liquid crystal element or an organic light emitting element (hereinafter, referred to as a "light emitting element") in each of a plurality of pixels provided on a substrate. The liquid crystal element or the light emitting element includes a layer containing a liquid crystal material or an organic compound between a pair of electrodes (hereinafter, the layer containing the organic compound will be referred to as an "organic layer" or an "EL layer), and is driven by a voltage applied between the pair of electrodes or by a current supplied to the pair of electrodes.

The substrate of such a display device may be flexible, so that a flexible display device is provided. For example, Japanese Laid-Open Patent Publication No. 2011-183916 discloses a display device including a flexible substrate and a plurality of display regions provided on the substrate. The substrate is folded at an optional angle at a position between the display regions, so that a plurality of display devices is provided on different curved surfaces.

SUMMARY

An embodiment of the present invention is directed to a display device. The display device includes a base film including a first region and a plurality of second regions having the first region therebetween. The display device further includes an inorganic insulating film on the base film, the inorganic insulating film being in contact with the plurality of second regions of the base film; a plurality of first pixels overlapping the first region; and a plurality of second pixels overlapping the plurality of second regions with the inorganic insulating film being between the plurality of second pixels and the plurality of second regions. The inorganic insulating film is divided by the first region and is discontinuous between the plurality of second regions.

An embodiment of the present invention is directed to a display device. The display device includes a base film including a first region and a second region; an underlying film on the base film, the underlying film being in contact with the first region and the second region of the base film; and a plurality of first pixels overlapping the first region and a plurality of second pixels overlapping the second region. The plurality of first pixels and the plurality of second pixels each include a semiconductor film and a gate electrode overlapping each other; and a gate insulating film between the semiconductor film and the gate electrode. The underlying film is thinner on the first region than on the second region.

An embodiment of the present invention is directed to a display device. The display device includes a base film including a first display region including a plurality of first pixels, a second display region including a plurality of second pixels, and a first region between the first display region and the second display region; and an inorganic insulating film overlapping the base film in the first display region and the second display region. The first region of the base film is exposed from the inorganic insulating film.

BRIEF DESCRIPTION OF DRAWINGS

FIG. 4 is a schematic cross-sectional view of the display device in an embodiment according to the present invention;

FIG. 5 is a schematic plan view of the display device in an embodiment according to the present invention;

FIG. 9B is a schematic cross-sectional view showing a step of the method for producing the display device in an embodiment according to the present invention;

FIG. 14 is a schematic cross-sectional view showing a step of the method for producing the display device in an embodiment according to the present invention;

FIG. 22 is schematic cross-sectional view of the display device in an embodiment according to the present invention;

DESCRIPTION OF EMBODIMENTS

Figure 1:
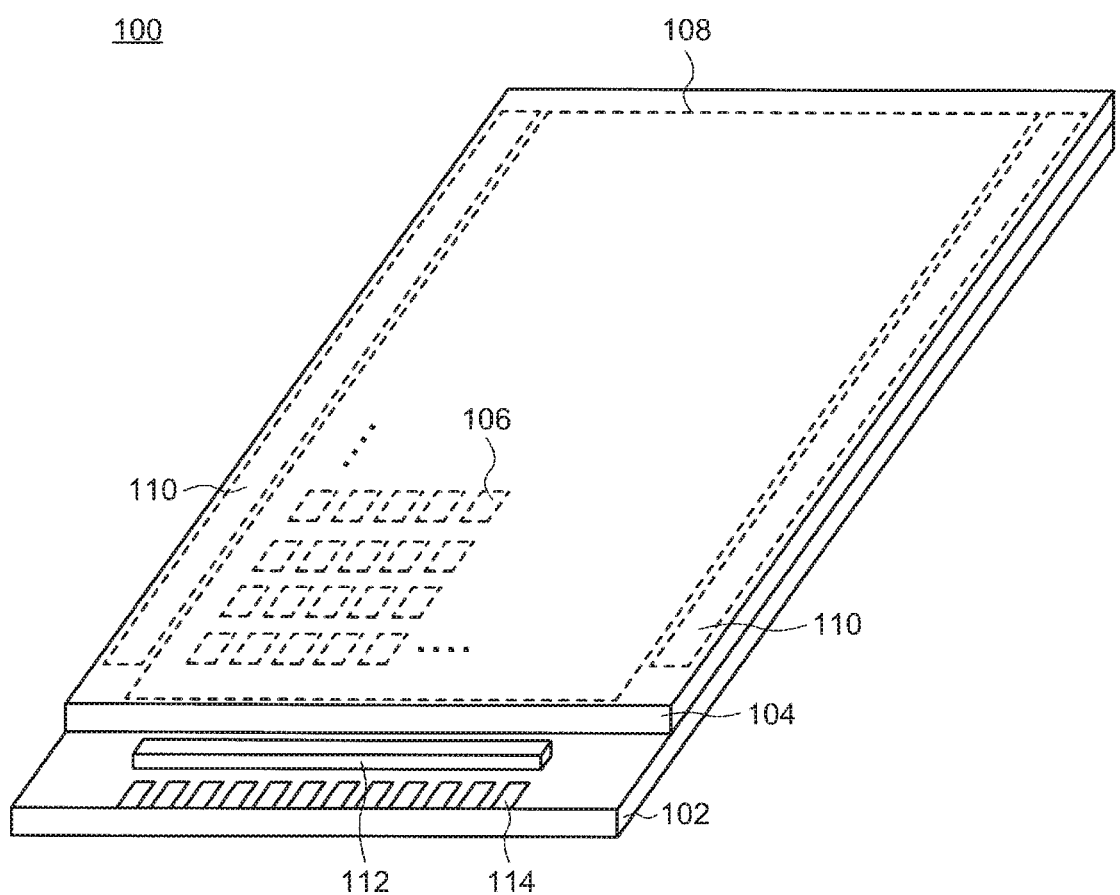
FIG. 1 is a schematic perspective view of a display device in an embodiment according to the present invention.

Hereinafter, embodiments of the present invention will be described with reference to the drawings and the like. The present invention may be carried out in various forms without departing from the gist thereof, and is not to be construed as being limited to any of the following embodiments.

In the drawings, components may be shown schematically regarding the width, thickness, shape and the like, instead of being shown in accordance with the actual sizes, for the sake of clearer illustration. The drawings are merely examples and do not limit the interpretations of the present invention in any way. In the specification and the drawings, components that have substantially the same functions as those described before with reference to a previous drawing(s) bear the identical reference signs thereto, and detailed descriptions thereof may be omitted.

In the present invention, in the case where one film is processed into a plurality of films, the plurality of films may have different functions or roles from each other. However, the plurality of films is derived from one, same film and are formed in the same step, and thus have the same layer structure and are formed of the same material as each other. Therefore, the plurality of films is defined as being in the same layer.

In the specification and the claims, an expression that a component is "on" another component encompasses a case where such a component is in contact with the another component and also a case where such a component is above or below the another component, namely, a case where still another component is provided between such a component and the another component, unless otherwise specified.

The embodiments of the present invention have an object of providing a highly reliable and flexible display device. The embodiments of the present invention have an object of providing a method for producing such a display device.

Embodiment 1

In this embodiment, a structure of a display device 100 in an embodiment according to the present invention will be described.

1. Overall Structure

FIG. 1 is a schematic perspective view of the display device 100. As shown in FIG. 1, the display device 100 includes a substrate 102, a counter substrate 104, and a plurality of pixels 106 located in a row direction and a column direction between the substrate 102 and the counter substrate 104. A region where the plurality of pixels 106 are located is a display region 108.

The plurality of pixels 106 each include a display element such as a liquid crystal element, a light emitting element or the like. The display device 100 further includes scanning line driving circuits 110 and a data line driving circuit 112 provided on the substrate 102. Various signals usable to drive the pixels 106 are input from an external circuit (not shown) to the scanning line driving circuits 110 and the data line driving circuit 112 via a connector such as a flexible printed circuit (FPC) or the like connected to terminals 114 provided on the substrate 102. Based on these signals, the display element in each pixel 106 is controlled, so that an image is reproduced in the display region 108.

The scanning line driving circuits 110 or the data line driving circuit 112 does not need to be provided directly on the substrate 102. Alternatively, neither the scanning line driving circuits 110 nor the data line driving circuit 112 needs to be provided directly on the substrate 102. The scanning line driving circuits 110 or the data line driving circuit 112 may be provided on a substrate different from the substrate 102 (a semiconductor substrate or the like) or a connector and drive the pixels 106. In the example of FIG. 1, the display region 108 and the scanning line driving circuits 110 provided on the substrate 102 are covered with the counter substrate 104, whereas the data signal driving circuit 112 provided on a different substrate is mounted on the substrate 102.

The substrate 102 and the counter substrate 104 may each be a flexible substrate. In this case, the substrate 102 may be called a "base film" or a "base plate", and the counter substrate 102 may be called a "cap film" or a "base plate". In the case where the substrate 102 and the counter substrate 104 are each a flexible substrate, the display device 100 is flexible. The counter substrate 104 may be a resin film or a circularly polarizing plate.

Figure 2:
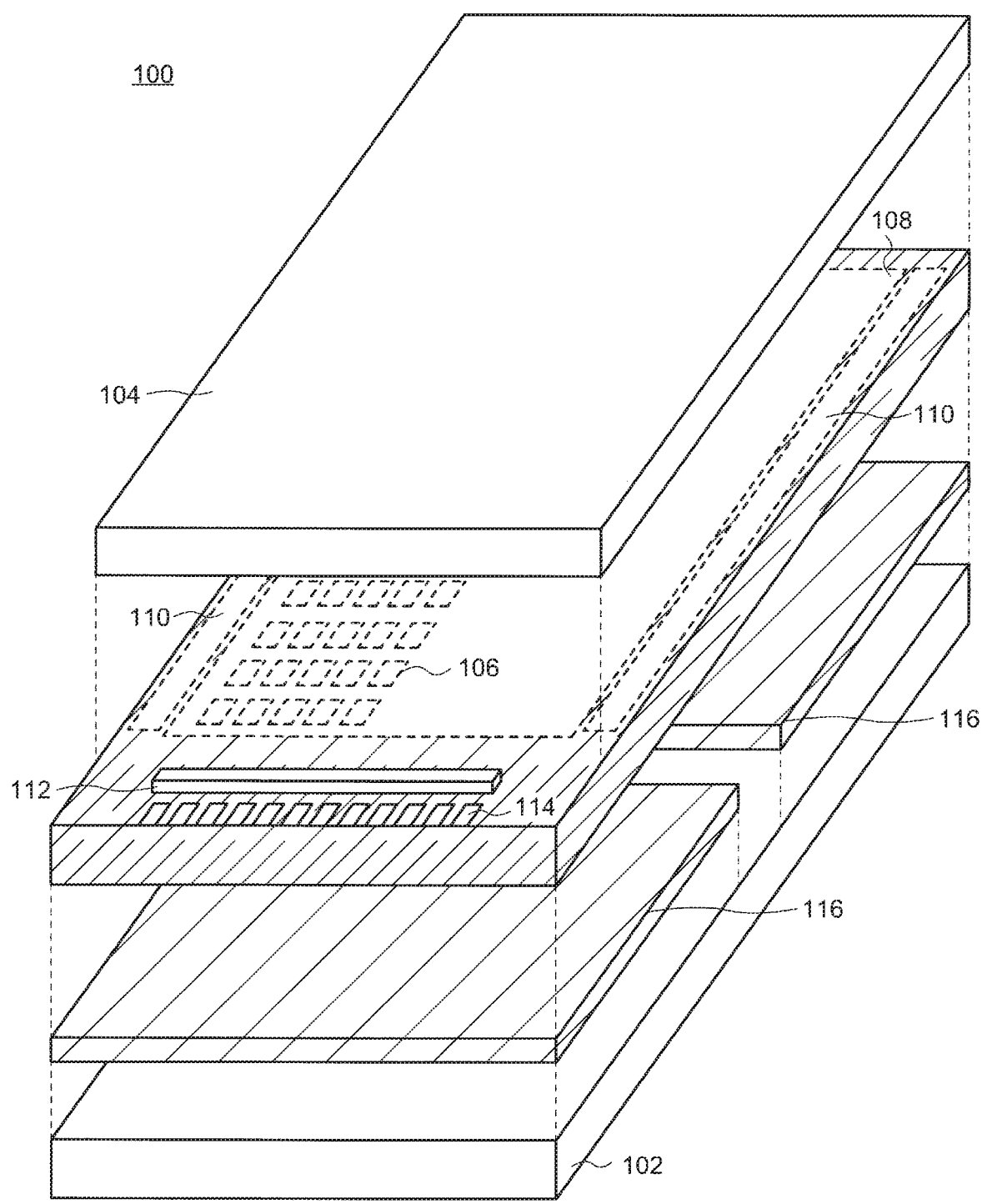
FIG. 2 is a schematic exploded perspective view of the display device in an embodiment according to the present invention.

FIG. 2 is a schematic exploded perspective view of the display device 100. As shown in FIG. 2, the display device 100 includes an underlying film 116 provided on, and in contact with, the substrate 102. The underlying film 116 does not need to cover the whole of a top surface of the substrate 102, and may partially cover the top surface of the substrate 102. Specifically, a part of the substrate 102 may be exposed from the underlying film 116 with no contact with the underlying film 116. The underlying film 116 may contain an inorganic insulating material as described below. Therefore, the underlying film 116 may be called an "inorganic insulating film". In the display device 100, the plurality of pixels 106 are located in both of a region where the underlying film 116 is provided and a region where the underlying film 116 is not in contact with the substrate 102.

Various types of patterned insulating films and conductive films are provided between the underlying film 116 and the counter substrate 104. A stack structure of these films forms the pixels 106, the scanning line driving circuits 110, the data line driving circuit 112, and the like.

Figure 3:
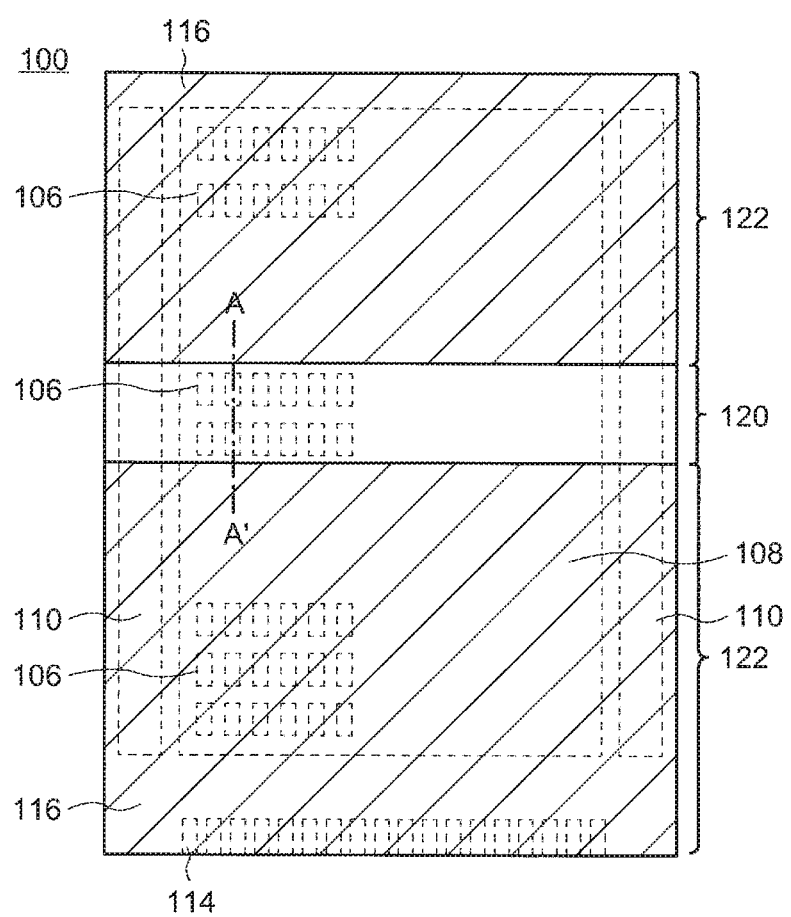
FIG. 3 is a schematic plan view of the display device in an embodiment according to the present invention.

FIG. 3 is a schematic plan view of the display device 100. FIG. 3 shows the substrate 102 and the underlying film 116 provided on the substrate 102. In FIG. 3, the regions where the display region 108 and the scanning line driving circuits 110 are provided are represented by dashed lines. As described above, the underlying film 116 does not need to cover the whole of the substrate 102. Specifically, the underlying film 116 is not provided on a partial region (first region) 120 of the substrate 102, and the top surface of the substrate 102 is exposed in the first region 120 from the underlying film 116. In the example of FIG. 3, the first region 102 of the substrate 102 is strip-like. The substrate 102 also includes two regions (second regions) 122, which have the first region 120 therebetween and are covered with the underlying film 116. The underlying film 116 is divided by the first region 120 and is discontinuous between the two second regions 122. In other words, the underlying film 116 has an opening or a slit, and the region of the substrate 102 in positional correspondence with the opening or the slit is the first region 120.

The first region 120 is provided to cross the display region 108, and a part of the plurality of pixels 106 (first pixels) overlap the first region 120. In this state, the pixels 106 overlapping the first region 120 are arrayed in a matrix. By contrast, the two second regions 122 overlap the display region 108 and a plurality of pixels 106 (second pixels) included in the display region 108. Namely, the plurality of pixels 106 overlapping each of the two second regions 122 are arrayed in a matrix. As shown in FIG. 3, the first region 120 may overlap the scanning line driving circuits 110.

FIG. 4 is a cross-sectional view of the display device 100 taken along chain line A-A' in FIG. 3. As shown in FIG. 4, the first region 120 of the substrate 102 is exposed from the underlying film 116. By contrast, the second regions 122 of the substrate 102 are in contact with the underlying film 116. The first region 120 and the second regions 122 both overlap the plurality of pixels 106. The plurality of pixels 106 each include a display element such as a light emitting element 170 or the like. Therefore, in the display device 100, the whole of the display region 108 overlapping the first region 120 and the second regions 122 reproduces an image.

2. Cross-Sectional Structure

FIG. 5 is a schematic plan view of two adjacent pixels 106 each including the light emitting element 170. In FIG. 5, the components are shown as not overlapping each other for visibility. A part of the components may overlap each other. A part of the components is omitted in FIG. 5.

As shown in FIG. 5, the display device 100 includes wirings, such as a plurality of gate lines 132, a plurality of data lines 130, a plurality of current supply lines 134 and the like. The gate lines 132 are each electrically connected with a plurality of pixels 106, and two of the pixels 106 are shown in FIG. 5. The data lines 130 and the current supply lines 134 are each connected with a plurality of pixels located along the lines 130 and 134 respectively.

The pixels 106 each include transistors 140 and 150. The transistor 140 includes a semiconductor film 142, a gate 144 (gate electrode), a drain 146 (drain electrode), a source 148 (source electrode), and the like. The gate 144 is a part of the corresponding gate line 132, and drain 146 is a part of the corresponding data line 130.

The transistor 150 includes a part of a semiconductor film 164, a gate 152 (gate electrode), a drain 154 (drain electrode), a source 156 (source electrode) and the like. The drain 154 is a part of the corresponding current supply line 134. The source 148 of the transistor 140 is connected with a first capacitor electrode 160 located in the same layer as the gate line 132, and a part of the first capacitor electrode 160 acts as the gate 152 of the transistor 150. Therefore, a signal generated by the data line driving circuit 112 and input from the data line 130 is input to the gate 152 of the transistor 150 via the transistor 140.

Figure 6A:
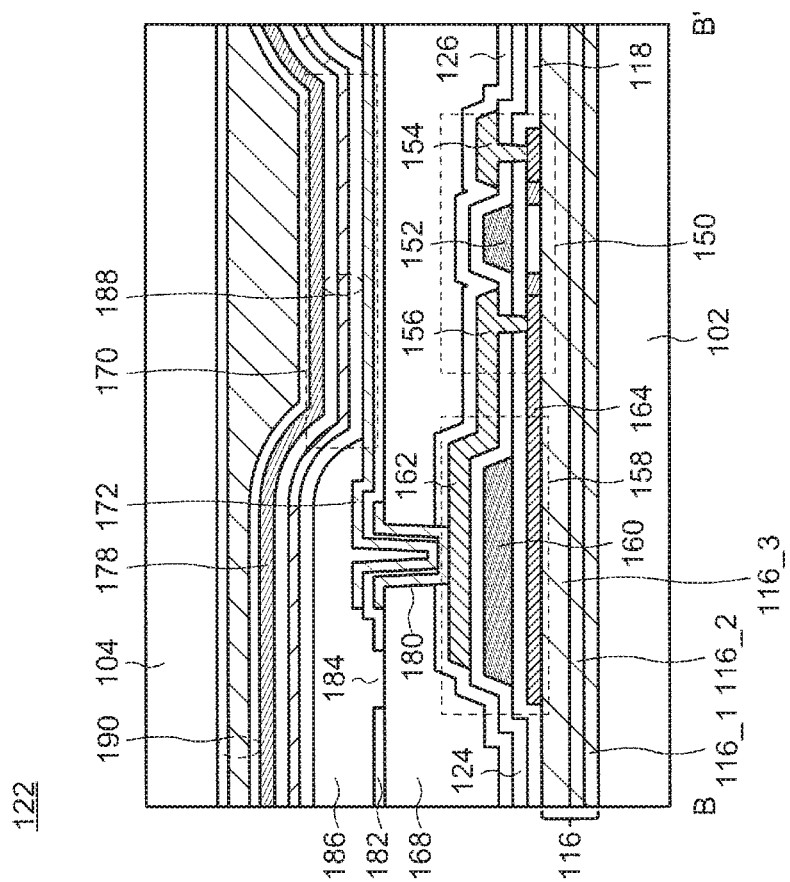
FIG. 6A is a schematic cross-sectional view of a pixel of the display device in an embodiment according to the present invention.
Figure 6B:
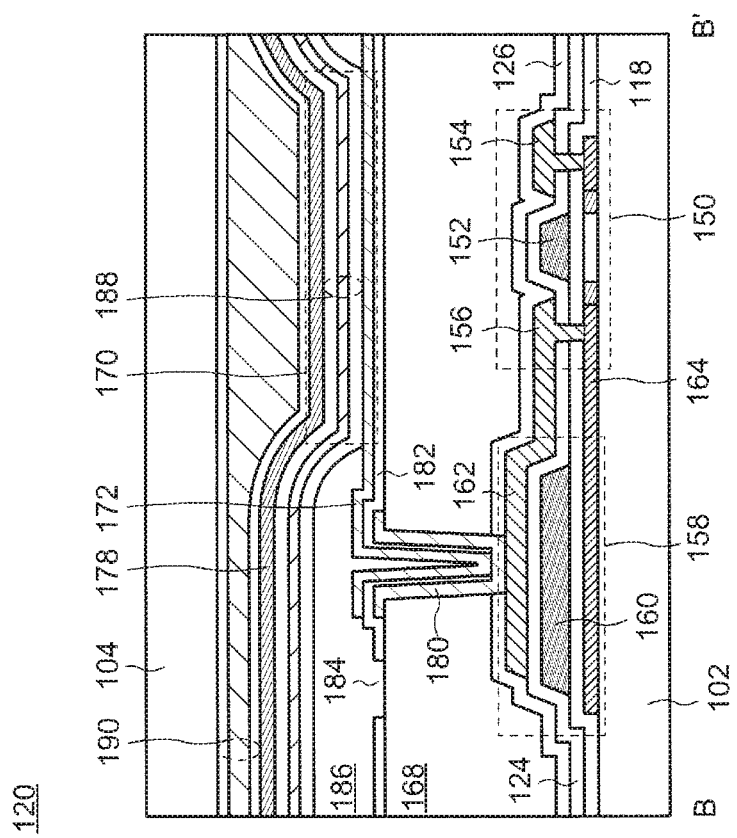
FIG. 6B is a schematic cross-sectional view of a pixel of the display device in an embodiment according to the present invention.

The semiconductor film 164 and a second capacitor electrode 162 are provided to overlap the first capacitor electrode 160. Although not shown in FIG. 5, an insulating film acting as a gate insulating film 118 of the transistor 140 and the transistor 150 is provided between the first capacitor electrode 160 and the semiconductor film 164 as described below. An insulating film acting as an interlayer insulating layer (represented by reference numeral 124 in FIG. 6A and the like) covering the gate 144 of the transistor 140 and the gate 152 of the transistor 150 is provided between the semiconductor film 164 and the second capacitor electrode 162. The first capacitor electrode 160, the gate insulating film 118, the semiconductor film 164, the interlayer insulating film 124, and the second capacitor electrode 162 form a capacitor 158 (FIG. 6A and FIG. 6B). The capacitor 158 contributes to maintaining the potential of the gate 152 of the transistor 150.

The pixel 106 further includes a storage capacitor electrode 166. The storage capacitor electrode 166 may be electrically connected with the corresponding current supply line 134. The pixel 106 includes a first electrode 172 acting as a pixel electrode. In FIG. 5, the first electrode 172 is not shown in the left pixel 106 for visibility. The first electrode 172 is electrically connected with the source 156 of the transistor 150. Although not shown in FIG. 5, the storage capacitor electrode 166, the first electrode 172 and an insulating film provided between the storage capacitor electrode 166 and the first electrode 172 form a storage capacitance. The storage capacitor contributes to maintaining the potential of the gate 152 of the transistor 150.

Although not shown in FIG. 5, a second electrode 178 of the light emitting element 170 is provided on the first electrode 172. The second electrode 178 is provided commonly for the plurality of pixels 106 and thus are shared by the plurality of pixels 106. An EL layer (not shown in FIG. 5; represented in FIG. 6A by reference numeral 188) is provided between the first electrode 172 and the second electrode 178. The light emitting element 170 includes the first electrode 172, the second electrode 178 and the EL layer. Although not shown, the pixel 106 is not limited to having the above-described structure. The pixel 106 may further include another wiring, transistor, capacitor or the like. Alternatively, the pixel 106 does not need to include the storage capacitor.

FIG. 6A and FIG. 6B are each a cross-sectional view of the display device 100 taken along a chain line B-B' in FIG. 5. FIG. 6A is a schematic cross-sectional view of the pixel 106 provided on the second region 122. FIG. 6B is a schematic cross-sectional view of the pixel 106 provided on the first region 120.

As shown in FIG. 6A, the pixel 106 includes the underlying film 116 provided on the second region 122 of the substrate 102. The underlying film 116 may contain an inorganic insulating material. Examples of the inorganic insulating material usable for the underlying film 116 include silicon-containing inorganic materials such as silicon oxide, silicon nitride, silicon nitride oxide, silicon oxide nitride, and the like. The underlying film 116 may have a single-layer structure or a stack structure of a plurality of layers. In the example of FIG. 6A, the underlying film 116 includes three layers (a first layer 116_1, a second layer 116_2 and a third layer 116_3). In this case, for example, the second layer 116_2 may contain silicon nitride, whereas the first layer 116_1 and the third layer 116_3 may contain silicon oxide. The first layer 116_1, the second layer 116_2 and the third layer 116_3 may respectively have thicknesses of 20 nm to 50 nm, 20 nm to 50 nm, and 100 nm to 500 nm.

On the second region 122, the transistor 150 is provided on the underlying film 116. A part of the gate insulating film 118 of the transistor 150, and the semiconductor film 164, may be in contact with the underlying film 116.

A part of the semiconductor film 164 also acts as one electrode of the capacitor 158. On the semiconductor film 164, the gate insulating film 118 and the first capacitor electrode 160 are provided. The interlayer insulating film 124 is provided to cover the first capacitor electrode 160 and the gate 152. On the interlayer insulating film 124, the second capacitor electrode 162 overlapping the first capacitor electrode 160 is provided. The second capacitor electrode 162 also acts as the source 156.

Optionally, the pixel 106 may further include a first passivation film 126 covering the transistor 150 and the capacitor 158.

On the transistor 150 and the capacitor 158, a flattening film 168 is provided to absorb the ruggedness caused by these components and provide a flat surface. The flattening film 168 has an opening, and the first electrode 172 of the light emitting element 170 is electrically connected with the source 156 of the transistor 150 via a connection electrode 180 in the opening.

On the flattening film 168, a partitioning wall 186 is provided to absorb the ruggedness caused by the opening of the flattening layer 168 and an end of the first electrode 172. The EL layer 188 and the second electrode 178 are provided on the first electrode 172 and the partitioning wall 186. The light emitting element 170 includes the first electrode 172, the EL layer 188, and the second electrode 178.

Optionally, the pixel 106 may further include a second passivation film 190 on the light emitting element 170. The second passivation film 190 prevents entrance of impurities such as water, oxygen and the like from outside.

The counter substrate 104 is provided on the light emitting element 170 or the second passivation film 190. Although not shown, an adhesive layer or the like may be provided between the light emitting element 170 or the second passivation film 190 and the counter substrate 104.

As shown in FIG. 6B, on the first region 120, the underlying film 116 is not provided in the pixel 106. Therefore, for example, a part of the gate insulating film 118 may be in contact with the substrate 102. The semiconductor film 164 may also be in contact with the substrate 102. The structure of the pixel 106 on the first region 120 is the same as that of the pixel 106 on the second region 122 except that the underlying film 116 is not provided on the first region 120. Since the underlying film 116 is not provided on the first region 120, the flattening layer 168 is thicker on the first region 120 than on the second region 122.

As described above, the underlying film 116 contains an inorganic insulating material, and thus is more rigid than a film containing an organic material. Therefore, when the display device 100 is bent or folded to be deformed, the underlying film 116 is easily cracked. Generation of cracks causes wirings provided on the underlying film 116 to be broken or disconnected. For example, the wirings such as the gate line 132, the data line 130, the current supply line 134 and the like, or the electrodes such as the first capacitor electrode 160, the second capacitor electrode 162, the storage capacitor electrode 166, the first electrode 172 and the like are broken or disconnected. As a result, light is not emitted from a part of or all of the pixels 106 in the display device 100. In this case, the display device 100 does not function as a display device.

Figure 7:
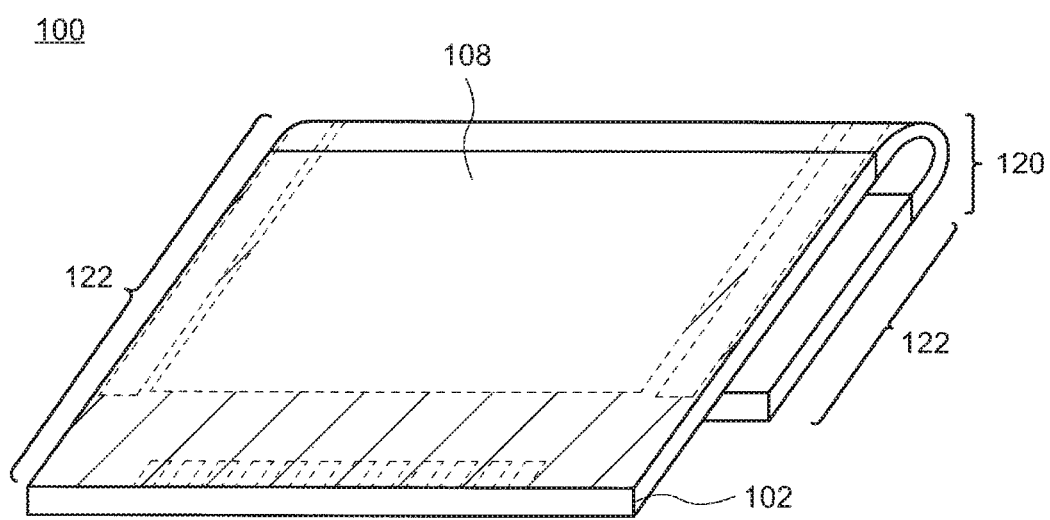
FIG. 7 is a schematic perspective of the display device in an embodiment according to the present invention.

However, as shown in FIG. 3 and FIG. 4, the display device 100 includes the first region 120, on which the underlying film 116 is provided. The display device 100 is bent in the first region 120 easily or selectively. In the case where, for example, the substrate 102, and thus the display device 100, has a three-dimensional structure shown in FIG. 7, the substrate 102 is bent in the first region 120 so that the display device 100 is deformed such that the two second regions 122 overlap each other. On the first region 120, the wiring or the electrodes are not broken or disconnected due to the breakage of the underlying film 116. In this manner, the breakage or the disconnection of the wiring is effectively suppressed. Thus, the breakage of the display device 100 is prevented. Therefore, the display device 100 in this embodiment is highly reliable and flexible.

Embodiment 2

In this embodiment, a display device 200 having a different structure from that of the display device 100 will be described. Components the same as or similar to those in embodiment 1 may not be described.

Unlike in the display device 100, in display device 200, the underlying film 116 is provided both on the first region 120 and the second regions 122, and the underlying film 116 is thinner on the first region 120 than on the second regions 122.

Figure 8A:
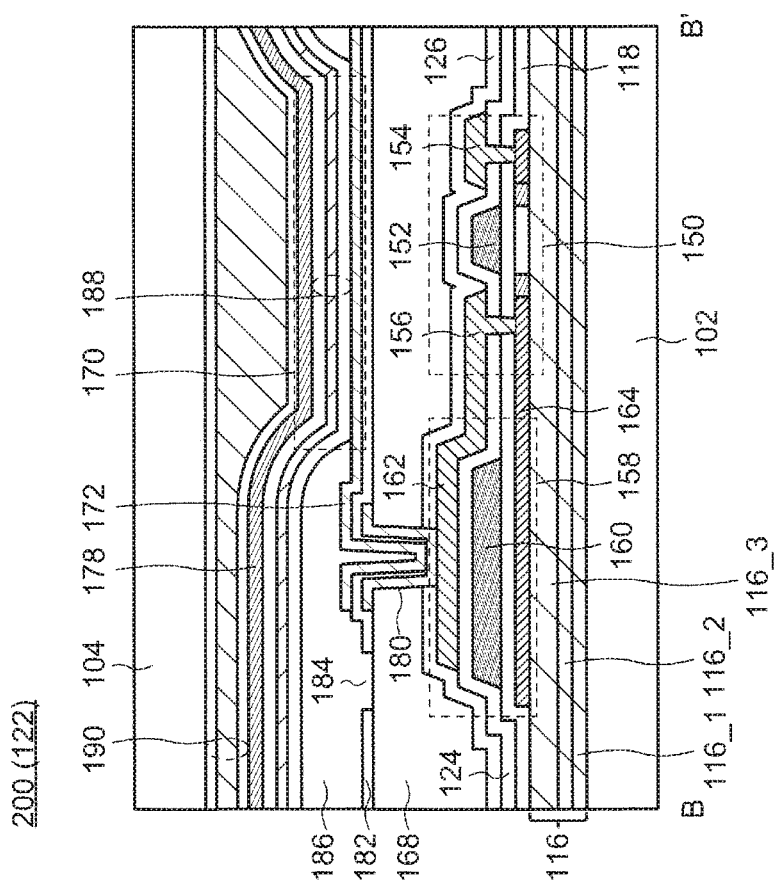
FIG. 8A is a schematic cross-sectional view of a pixel of a display device in an embodiment according to the present invention.
Figure 8B:
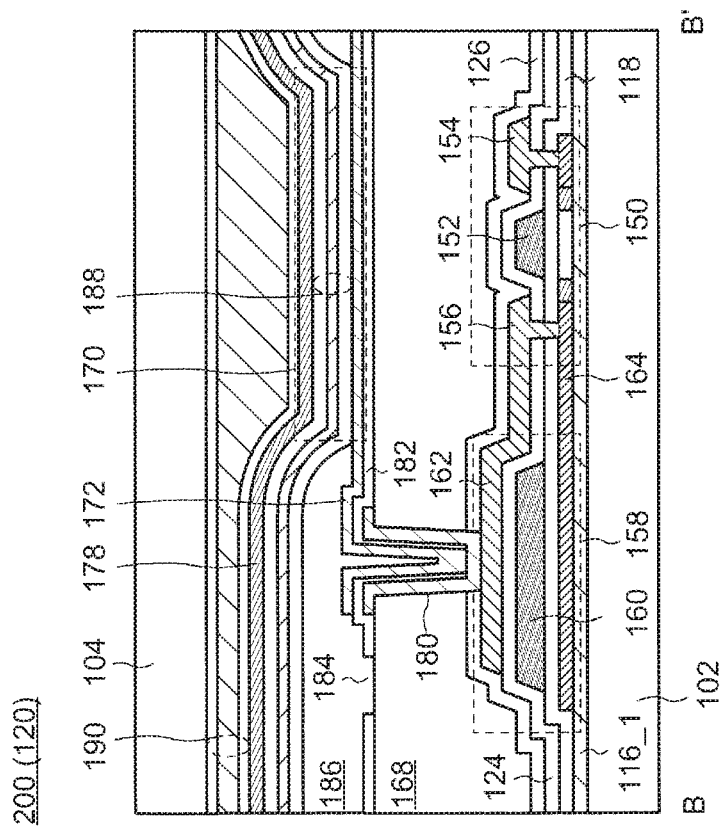
FIG. 8B is a schematic cross-sectional view of a pixel of the display device in an embodiment according to the present invention.

FIG. 8A and FIG. 8B are each a cross-sectional view of the display device 200 corresponding to cross section taken along a chain line B-B' in FIG. 5. FIG. 8A is a schematic cross-sectional view of the pixel 106 provided on the second region 122. FIG. 8B is a schematic cross-sectional view of the pixel 106 provided on the first region 120. As shown in FIG. 8A, on the second region 122, the pixel 106 is substantially the same as that in the display device 100. The underlying film 116 is provided between the substrate 102 and the transistor 150, and the underlying film 116 is in contact with the substrate 102.

In the display device 200, a part of the underlying film 116 extends from the second region 122 to the first region 120, and is sandwiched by the transistor 150 in the pixel 106 and the first region 120 of the substrate 102. In the example of FIG. 8B, the first layer 116_1 extends from the second region 122 to the first region 120. Therefore, the number of the layer(s) of the underlying film 116 or the thickness of the underlying film 116 is smaller on the first region 120 than on the first region 120. Although not shown, the second layer 116_2 or the third layer 116_3 may extend to the first region 120 instead of the first layer 116_1.

With such a structure, in embodiment 2, like in embodiment 1, the first region 120 is more flexible than the second regions 122, and the display device 200 is deformed more easily in the first region 120 than in the second regions 122. Even though the first region 120 is bent to deform the display device 200, the underlying film 116 is not easily cracked on the first region 120 because the underlying film 116 is thinner on the first region 120. In this manner, the breakage or the disconnection of the wirings and the electrodes is suppressed. Thus, the breakage of the display device 100 is prevented. Therefore, the display device 200 in this embodiment is highly reliable and flexible.

Since the underlying film 116 is provided also on the first region 120, entrance of impurities such as alkaline ions or the like from the first substrate 102 to the transistors 140 and 150 is prevented. This provides high reliability for the semiconductor element used to drive the display device 200.

Embodiment 3

In this embodiment, a method for manufacturing the display device 100 in embodiment 1 will be described with reference to FIG. 6A, FIG. 6B and FIG. 9A through FIG. 17. Components the same as or similar to those in embodiment 1 may not be described. FIG. 9A through FIG. 17 each correspond to FIG. 6A and
FIG. 6B. FIG. 9A through FIG. 17 each provide cross-sectional views of the pixels 106 on the second region 122 and the first region 120. The cross-sectional views in FIG. 9A through FIG. 17 correspond to cross section taken along a chain line B-B' in FIG. 5.

1. Underlying Film

Figure 9A:
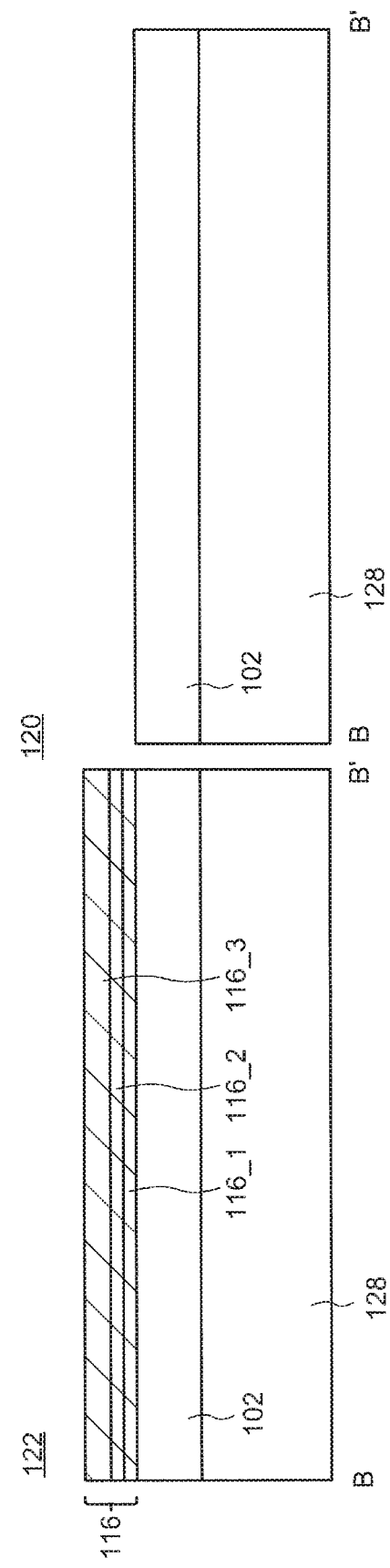
FIG. 9A is a schematic cross-sectional view showing a step of a method for producing a display device in an embodiment according to the present invention.

As shown in FIG. 9A, the substrate 102 is formed on a support substrate 128. The support substrate 128 has a function of supporting the substrate 102 and various other components formed on the substrate 102, for example, the transistors 140 and 150, the capacitor 158, the light emitting element 170 and the like. Therefore, the support substrate 128 may be formed of a material that is resistant against the temperature of processes performed on the components to be formed thereon and is chemically stable against chemicals used in the steps. Specifically, the support substrate 128 may contain glass, quartz, plastics, a metal, ceramics or the like.

The substrate 102 is formed of a flexible insulating film, and may contain, for example, a polymer material. Examples of the polymer material usable for the substrate 102 include a polyimide, a polyamide, a polyester, a polycarbonate and the like. These polymer materials may be chain-like or may form a three-dimensional network by intermolecular crosslinking. The substrate 102 may be formed by, for example, a wet film formation method such as printing, ink-jetting, spin-coating, dip-coating or the like, or by lamination. Alternatively, the substrate 102 may be formed by forming precursors of any of the above-described polymer materials on the support substrate 128 and causing a polymer reaction of the precursors.

Next, as shown in FIG. 9A, the underlying film 116 is formed on the second region 122 of the substrate 102. As described above in embodiment 1, the underlying film 116 may contain an inorganic insulating material such as silicon nitride, silicon oxide, silicon nitride oxide, silicon oxide nitride or the like. The underlying film 116 may be formed by chemical vapor deposition (CVD), sputtering or the like to have a single-layer structure or a stack structure. For example, the underlying film 116 may be formed on substantially the whole of the top surface of the substrate 102, and then a part of the underlying film 116 that is on the first region 120 may be selectively removed by etching. In the case of having a stack structure, the underlying film 116 may include, for example, a silicon nitride layer sandwiched between silicon oxide layers. In the example of FIG. 9A, the underlying film 116 has a three-layer structure including the first layer 116_1, the second layer 116_2 and the third layer 116_3.

2. Transistors

Next, the semiconductor film 164 is formed in each of the pixels 106 (FIG. 9B). The semiconductor film 164 may contain a Group 14 element such as silicon or the like. Alternatively, the semiconductor film 164 may contain an oxide semiconductor. Examples of the oxide semiconductor usable for the semiconductor film 164 include a Group 13 element such as indium, gallium or the like, for example, a mixed oxide of indium and gallium (IGO). In the case of containing an oxide semiconductor, the semiconductor film 164 may further contain a Group 12 element. Examples of the Group 12 element that may be contained in the semiconductor film 164 include a mixed oxide containing indium, gallium and zinc (IGZO). There is no specific limitation to the crystallinity of the semiconductor film 164. The semiconductor film 164 may be single crystalline, polycrystalline, microcrystalline or amorphous. Alternatively, these crystalline states may be mixed in the semiconductor film 164.

In the case of containing silicon, the semiconductor film 164 may be formed by CVD using silane gas or the like as a raw material. The obtained amorphous silicon may be heated or exposed to light such as laser light or the like to be crystallized. In the case of containing an oxide semiconductor, the semiconductor film 164 may be formed by sputtering or the like.

Next, the semiconductor film 164 is subjected to first doping. Specifically, the first doping is performed as follows. A resist mask 198 is formed on the semiconductor film 164 to cover a region where a channel of the transistor 150 is to be formed (FIG. 9B). In this state, the semiconductor film 164 is doped with ion. Examples of the usable ion include ion of phosphorus or nitrogen that provides n-type conductivity and ion of boron that provides p-type conductivity. After that, the resist mask 198 is removed. As a result, as shown in FIG. 10A, doped regions 164_1 and an undoped region 164_2 are formed in the semiconductor film 164.

Figure 10A:
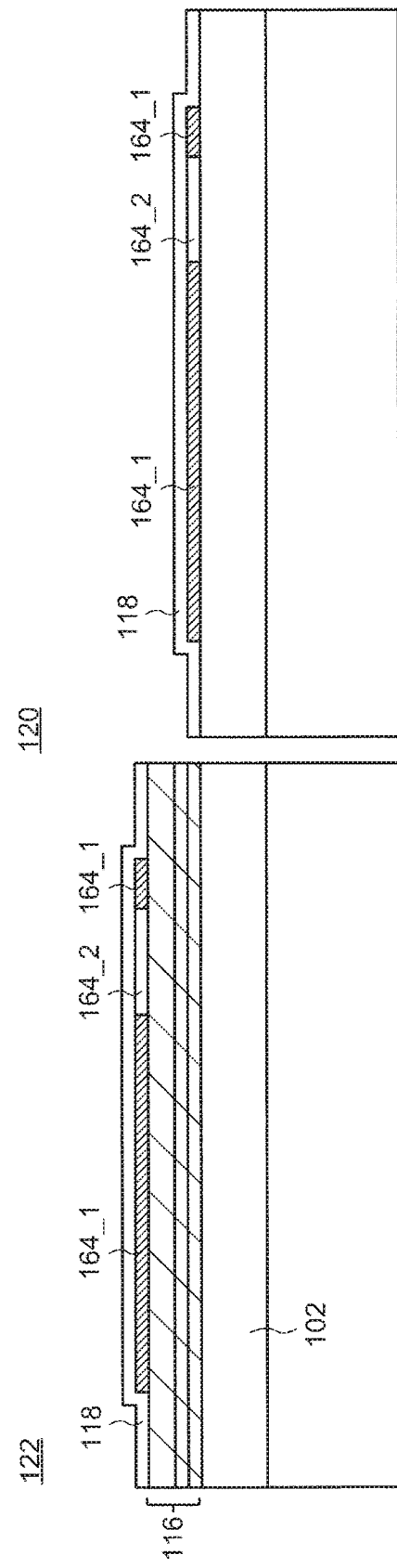
FIG. 10A is a schematic cross-sectional view showing a step of the method for producing the display device in an embodiment according to the present invention.

Next, the gate insulating film 118 is formed to cover the semiconductor film 164 (FIG. 10A). The gate insulating film 118 may have a single-layer structure or a stack structure. The gate insulating film 118 may contain a material usable for the underlying film 116. The gate insulating film 118 may be formed by CVD, sputtering or the like.

Figure 10B:
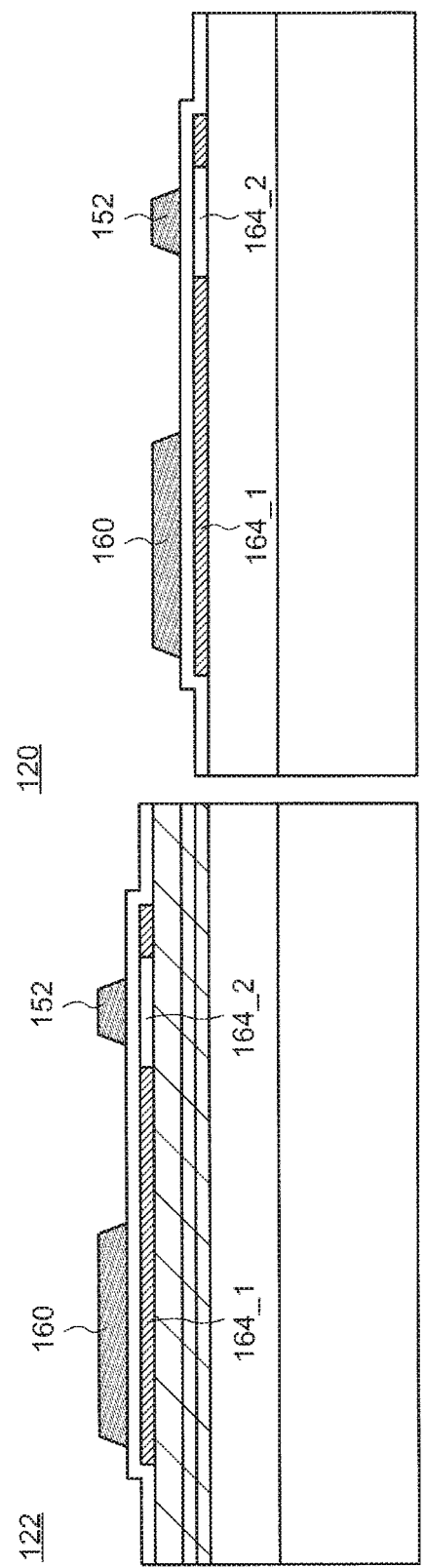
FIG. 10B is a schematic cross-sectional view showing a step of the method for producing the display device in an embodiment according to the present invention.

Next, the gate 152 and the first capacitor electrode 160 are formed on the gate insulating film 118 by sputtering or CVD (FIG. 10B). The gate 152 and the first capacitor electrode 160 are formed in the same layer. The gate 152 is formed to overlap the undoped region 164_2. The first capacitor electrode 160 is formed to overlap the doped region 164_1. The gate 152 and the first capacitor electrode 160 may be formed of a metal such as titanium, aluminum, copper, molybdenum, tungsten, tantalum or the like or an alloy thereof, and may be formed to have a single-layer structure or a stack structure. For example, the gate 152 and the first capacitor electrode 160 may have a stack structure including a layer of a highly conductive metal material such as aluminum, copper or the like and a layer of a high melting point such as titanium, tungsten, molybdenum or the like formed on a layer of a metal with a highly conductive metal. Alternatively, the gate 152 and the first capacitor electrode 160 may have a structure in which a layer of a highly conductive metal is sandwiched between layers of a metal with a high melting point.

Figure 11A:
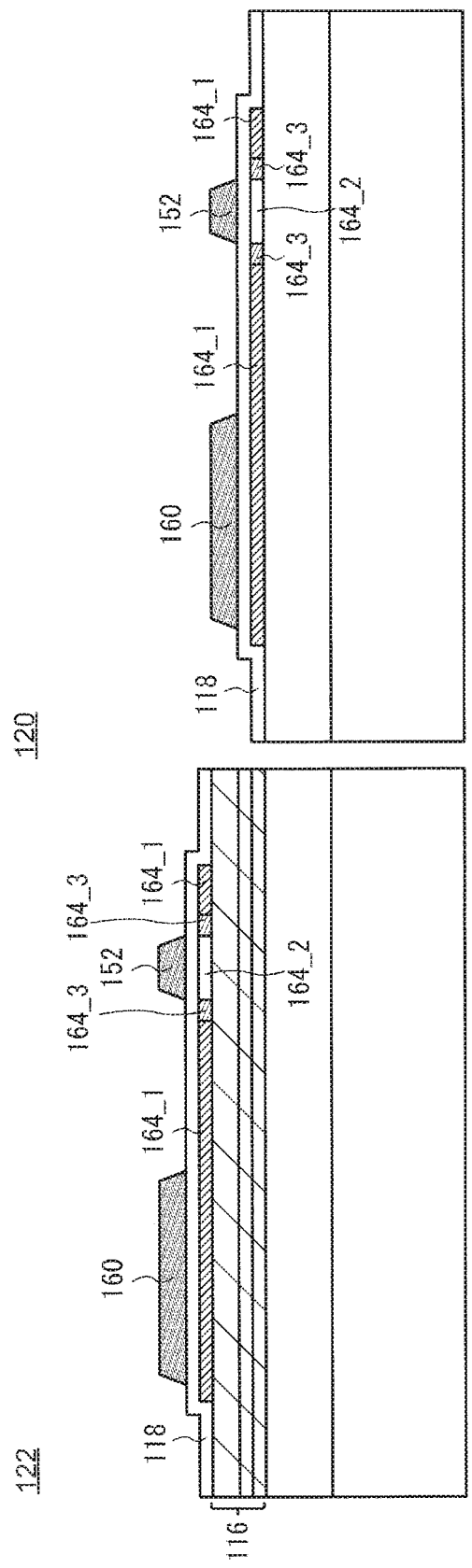
FIG. 11A is a schematic cross-sectional view showing a step of the method for producing the display device in an embodiment according to the present invention.

Next, the semiconductor film 164 is subjected to second doping with the gate 152 being used as a mask. The conditions for the second doping are adjusted such that the semiconductor film 164 is doped with a dopant at a lower concentration than in the first doping. As a result, low concentration impurity regions 164_3 are formed in a region of the undoped region 164_2 that does not overlapping the gate 152 (FIG. 11A). The low concentration impurity regions 164_3 have a lower concentration of impurities than that of the doped regions 164_1. The undoped region 164_2 is a region not doped with impurities or not substantially doped with impurities, and acts as a channel region.

Figure 11B:
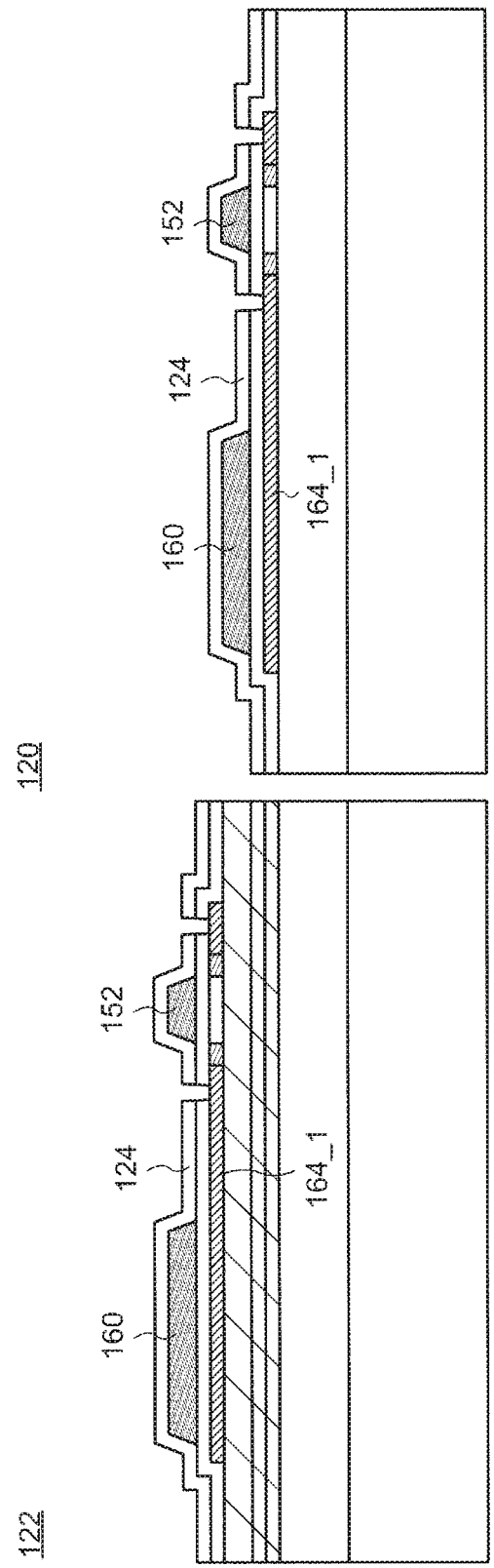
FIG. 11B is a schematic cross-sectional view showing a step of the method for producing the display device in an embodiment according to the present invention.

Next, the interlayer insulating layer 124 is formed on the gate 152 and the first capacitor electrode 160 (FIG. 11B). The interlayer insulating layer 124 may have a single-layer structure or a stack structure, and may contain a material usable for the underlying film 116. The interlayer insulating layer 124 may be formed by CVD, sputtering or the like.

Next, the interlayer insulating layer 124 and the gate insulating film 118 are etched to form openings reaching the doped regions 164_1 (FIG. 11B). The openings may be formed, for example, by plasma etching in gas containing a fluorine-containing hydrocarbon.

Figure 12A:
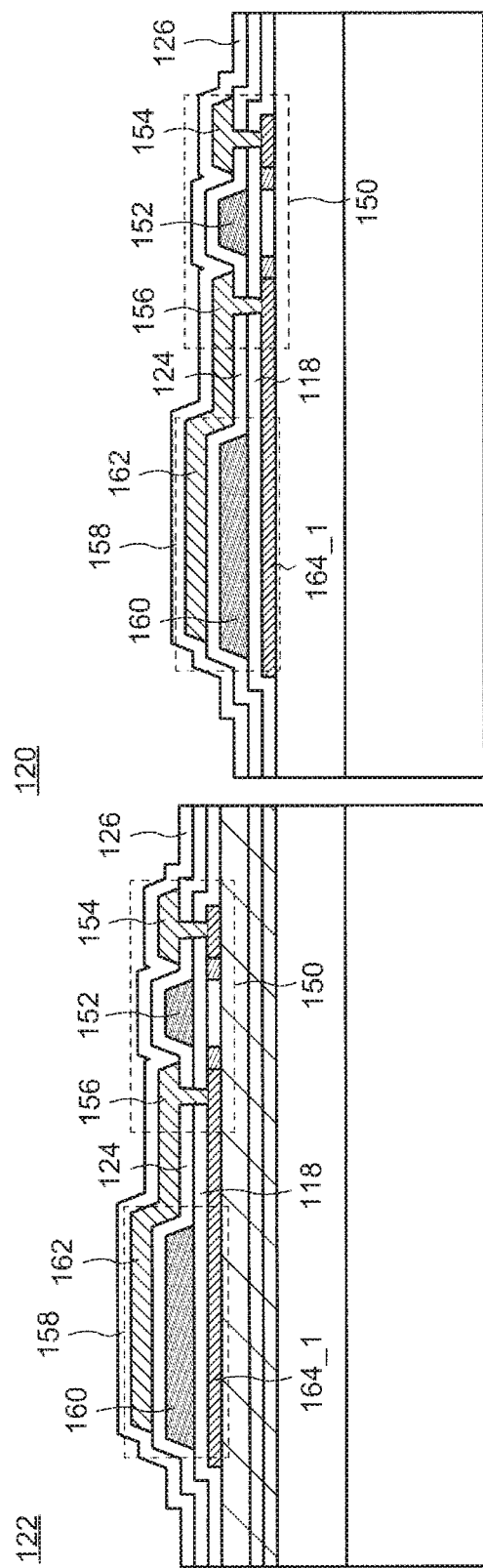
FIG. 12A is a schematic cross-sectional view showing a step of the method for producing the display device in an embodiment according to the present invention.

Next, a metal film is formed to cover the openings and is etched. As a result, the source 156 and the drain 154 are formed (FIG. 12A). The source 156 also acts as the second capacitor electrode 162, and partially overlaps the first capacitor electrode 160. A part of the doped region 164_1 that overlaps the first capacitor electrode 160, a part of the gate insulating film 118 that overlaps the first capacitor electrode 160, the first capacitor electrode 160, and a part of the interlayer insulating film 124 that is sandwiched between the first capacitor electrode 160 and the second capacitor electrode 162, and the second capacitor electrode 162 form the capacitor 158. The capacitor 158 contributes to maintaining the potential of the gate 152.

The metal film may contain a metal usable for the gate 152, and may have a single structure or a stack structure. The metal film may be formed by sputtering or CVD.

As a result of performing the above-described steps, the transistor 150 is formed. The transistor 140 may be formed by substantially the same process.

3. Intermediate Layers

Optionally, the first passivation film 126 may be formed on the transistor 150 (FIG. 12A). The first passivation film 126 may have a single-layer structure or a stack structure and may contain an inorganic insulating material. Examples of the inorganic insulating material usable for the first passivation film 126 include silicon-containing inorganic insulating materials such as silicon oxide, silicon nitride, silicon nitride oxide, silicon oxide nitride, and the like. The first passivation film 126 may be formed by sputtering or CVD.

Figure 12B:
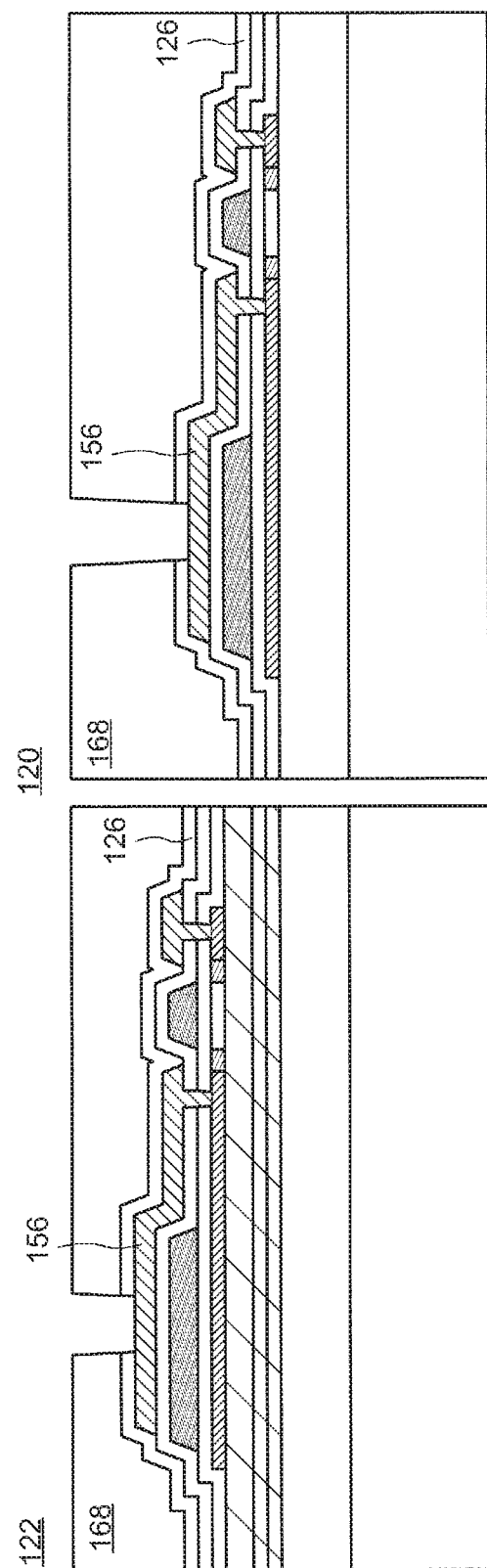
FIG. 12B is a schematic cross-sectional view showing a step of the method for producing the display device in an embodiment according to the present invention.

Next, the flattening film 168 is formed (FIG. 12B). The flattening film 168 absorbs the ruggedness caused by the transistor 150, the capacitor 158 and the like and provides a flat surface. The flattening film 168 may be formed of an organic insulating material. Examples of the organic insulating material usable for the flattening film 168 include polymers such as an epoxy resin, an acrylic resin, a polyimide, a polyamide, a polyester, a polycarbonate, a polysiloxane, and the like. The flattening film 168 may be formed by a wet film formation method described above.

Figure 13A:
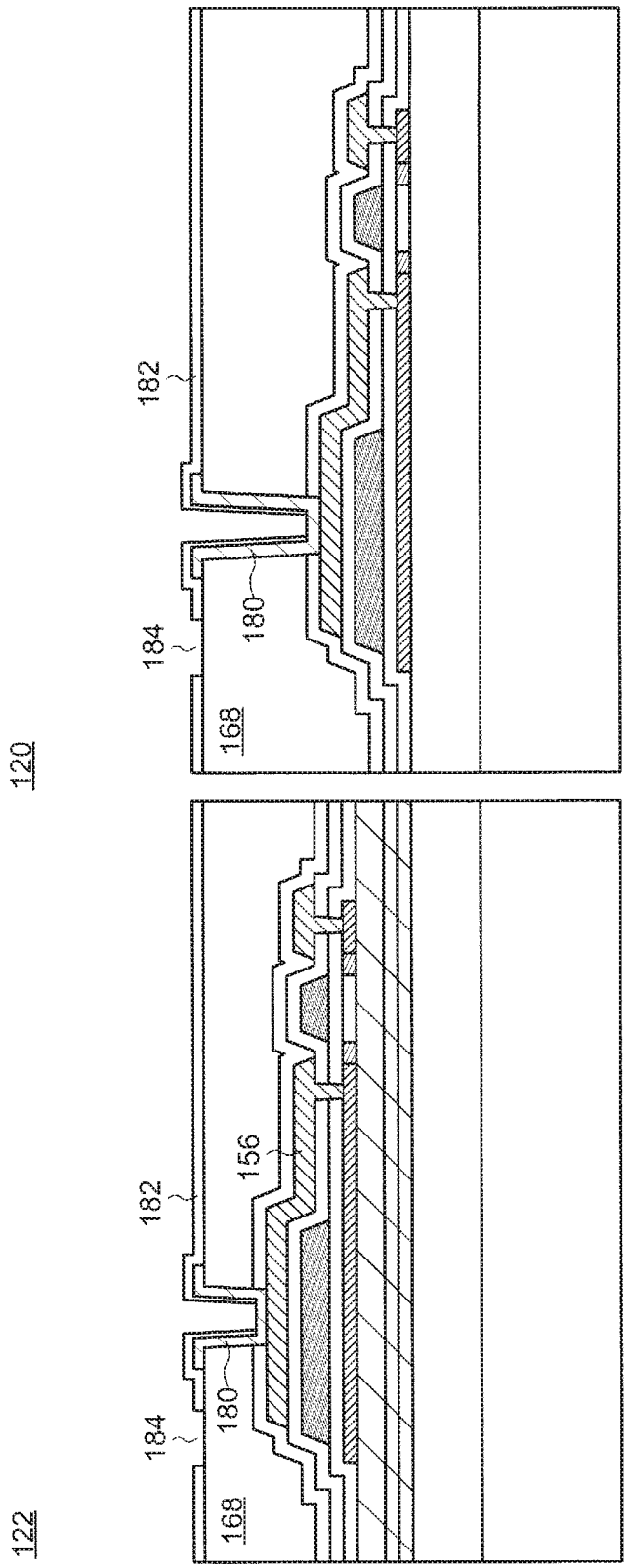
FIG. 13A is a schematic cross-sectional view showing a step of the method for producing the display device in an embodiment according to the present invention.

Next, the flattening film 168 and the first passivation film 126 are etched to form an opening reaching the source 156 (FIG. 12B). Then, the connection electrode 180 is formed to cover the opening (FIG. 13A). The connection electrode 180 may be formed of a light-transmissive conductive oxide such as, for example, indium tin oxide (ITO), indium zinc oxide (IZO) or the like, and may be formed by sputtering or the like. It is not absolutely necessary to form the connection electrode 180, but the connection electrode 180 protects exposed surfaces such as a surface of the source 156 and the like in subsequent steps and thus prevents increase in the contact resistance.

Although not shown, the storage capacitor electrode 166 (FIG. 5) may be formed after the formation of the connection electrode 180. The storage capacitor electrode 166 may be formed of, for example, a metal such as aluminum, copper, titanium, molybdenum, tungsten, tantalum or the like or an alloy thereof. The storage capacitor electrode 166 may have a single-layer structure or a stack structure. For example, the storage capacitor electrode 166 may have a structure of molybdenum/aluminum/molybdenum. The storage capacitor electrode 166 forms a storage capacitor together with the first electrode 172 of the light emitting element 170 to be formed in a later process.

Then, an insulating film 182 is formed (FIG. 13A). The insulating film 182 also acts as a dielectric for the storage capacitance. The insulating film 182 may contain a material usable for the underlying film 116 or the gate insulating film 118, exemplified by silicon nitride. The insulating film 182 may be formed by the same method as that of the underlying film 116 or the gate insulating film 118. The insulating film 182 has an opening that exposes a part of a contact portion electrically connecting the transistor 150 and the light emitting element 170 to each other (namely, that exposes a bottom surface of the connection electrode 180 formed in the opening of the flattening film 168).

4. Light Emitting Element

Figure 13B:
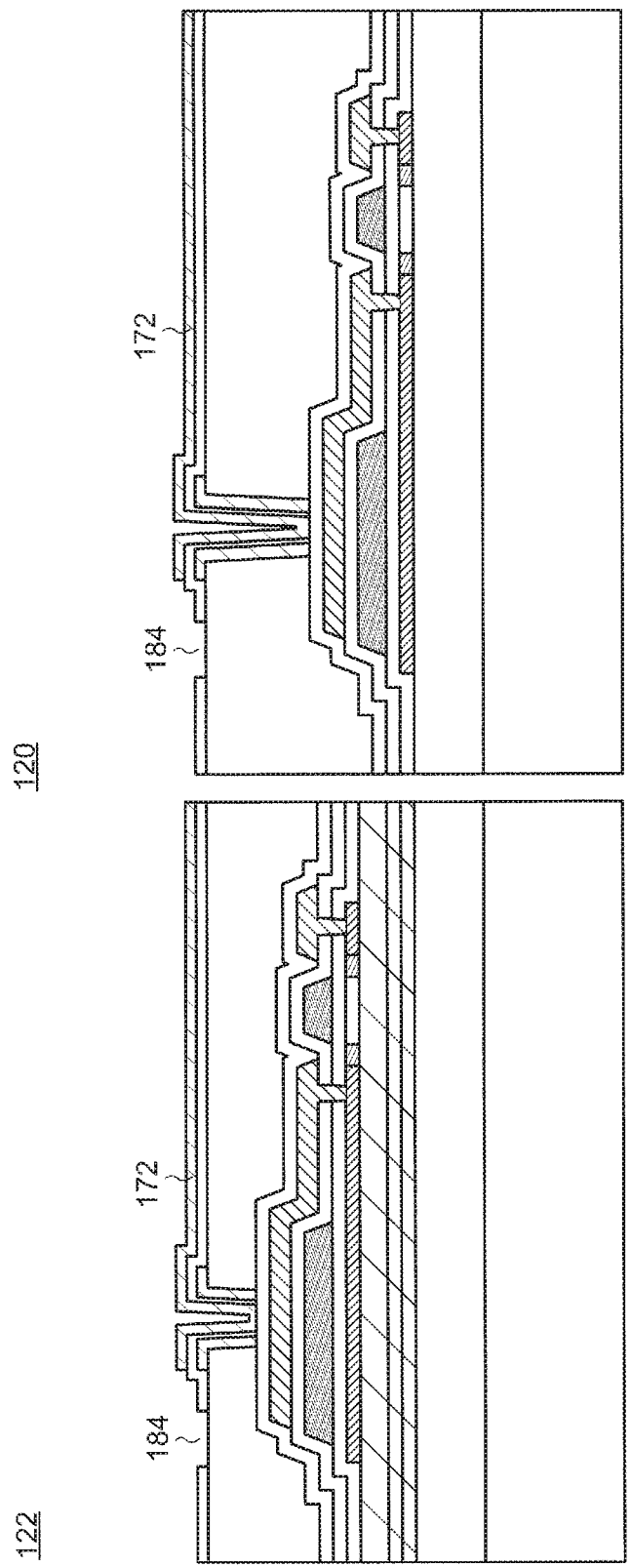
FIG. 13B is a schematic cross-sectional view showing a step of the method for producing the display device in an embodiment according to the present invention.

Next, the first electrode 172 of the light emitting element 170 is formed (FIG. 13B). In the case where light from the light emitting element 170 is output via the first electrode 172, the first electrode 172 may be formed of a light-transmitting material, for example, a conductive oxide such as ITO, IZO or the like. By contrast, in the case where light from the light emitting element 170 is output from the side opposite to the first electrode 172 (namely, via the second electrode 178), the first electrode 172 may be formed of a metal such as aluminum, silver or the like or an alloy thereof. Alternatively, the first electrode 172 may have a stack structure of any of the above-listed metal or an alloy thereof and a conductive oxide. For example, the first electrode 172 may have a stack structure in which a layer of a metal is sandwiched between layers of a conductive oxide (e.g., ITO/silver/ITO, etc.).

After the first electrode 172 is formed, the partitioning wall 186 is formed (FIG. 14). The partitioning wall 186 has a function of absorbing the steps caused by the end of the first electrode 172 and the opening formed in the flattening film 168, and also a function of electrically insulating the first electrodes 172 of the adjacent pixels 106 from each other. The partitioning wall 186 is also referred to as a "bank" or a "rib". The partitioning wall 186 may be formed of a material usable for the flattening film 168. The partitioning wall 186 has an opening that exposes a part of the first electrode 172, and an edge of the opening is preferably moderately tapered. Such a shape prevents coverage failure for the EL layer 188 or the second electrode 178 to be formed in a later step.

As shown in FIG. 13A, FIG. 13B and FIG. 14, an opening 184 may be formed in the insulating film 182 in order to allow the flattening film 168 and the partitioning wall 186 to be in direct contact with each other. Such a structure allows impurities such as water, desorbed from the flattening film 168, and the like to be released via the partitioning wall 186 in a heat treatment or the like performed after the formation of the partitioning wall 186.

Figure 15:
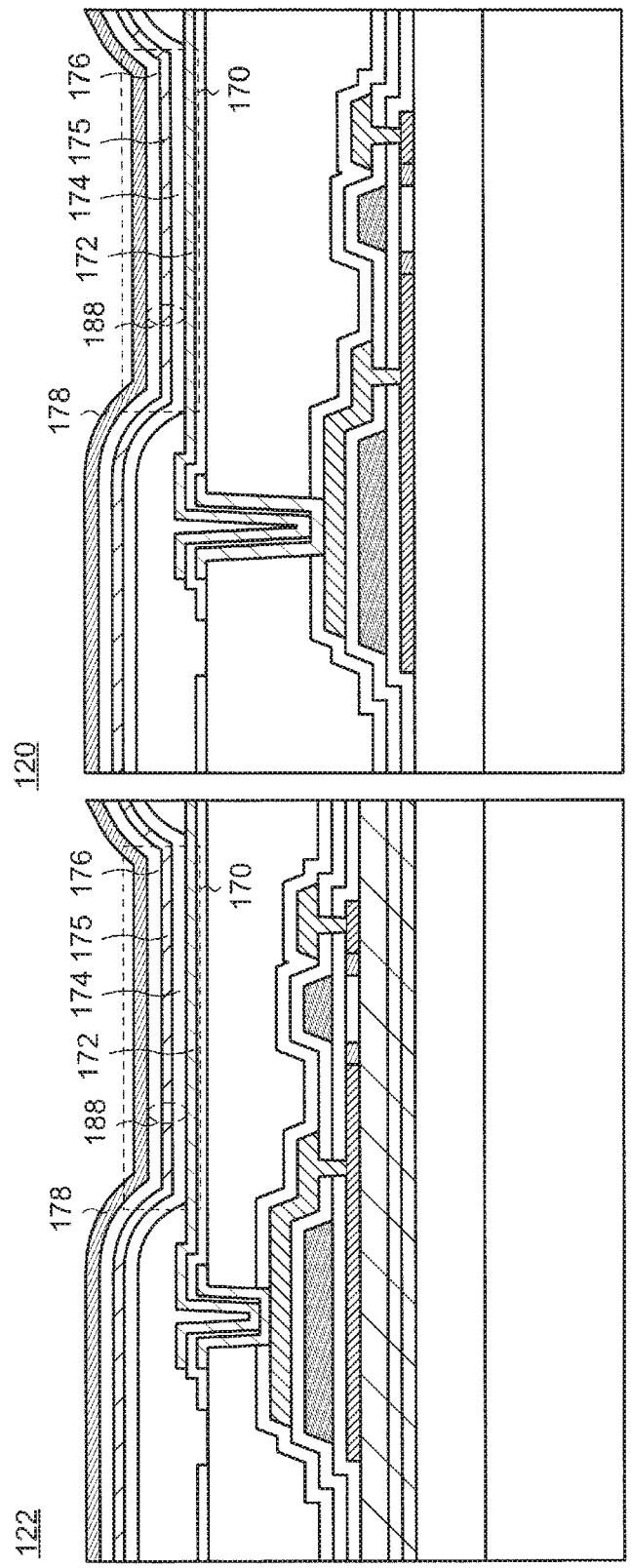
FIG. 15 is a schematic cross-sectional view showing a step of the method for producing the display device in an embodiment according to the present invention.

After the formation of the partitioning wall 186, the EL layer 188 of the light emitting element 170 is formed, and the second electrode 178 is formed on the EL layer 188 (FIG. 15). In the example of FIG. 15, the EL layer 188 has a three-layer structure including a first layer 174, a second layer 175 and a third layer 176. The EL layer 188 is not limited to having such a structure, and may have a single-layer structure or a stack structure including four or more layers. For example, the EL layer 188 may optionally include a charge injection layer, a charge transfer layer, a light emitting layer, a charge blocking layer, an exciton blocking layer or the like. Alternatively, one layer may have functions of a plurality of layers. The EL layer 188 may be formed by vapor deposition, ink-jetting, printing, spin-coating or the like.

In the example of FIG. 15, the first layer 174 and the third layer 176 of the EL layer 188 are respectively a charge injection layer and a charge transfer layer, or each have a stack structure of a charge injection layer and a charge transfer layer. The first layer 174 and the third layer 176 may be formed commonly for the pixels 106 adjacent to each other. Namely, the first layer 174 and the third layer 176 may be shared by the pixels 106. By contrast, the second layer 175 is a light emitting layer, and although not shown, may be formed of a different material or may have a different structure among the pixels 106 adjacent to each other. Thus, the adjacent pixels 106 emit light of different colors. Alternatively, the second layer 175 may have a structure for emitting white light and may be formed to be shared by all the pixels 106. In this case, color filters or the like may be used so that a wavelength of light output from each pixel 106 is selected to provide full-color display.

After the formation of the EL layer 188, the second electrode 178 is formed (FIG. 15). The first electrode 172, the EL layer 188 and the second electrode 178 form the light emitting element 170. Carriers (electrons and holes) are injected from the first electrode 172 and the second electrode 178 into the EL layer 188, and the carriers are recombined to provide an excited state. The excited state is relaxed to a ground state. As a result, light is emitted. Therefore, in the light emitting element 170, a region where the EL layer 188 and the first electrode 172 are in direct contact with each other is a light emitting region.

In the case where light from the light emitting element 170 is output via the first electrode 172, the second electrode 178 may be formed of a metal such as aluminum, silver or the like or an alloy thereof. By contrast, in the case where light from the light emitting element 170 is output via the second electrode 178, the second electrode 178 is formed of any of the above-listed metal or an alloy thereof and may be formed to have such a thickness so as to transmit visible light. Alternatively, the second electrode 178 may be formed of a light-transmitting material, for example, a conductive oxide such as ITO, IZO or the like. Still alternatively, the second electrode 178 may have a stack structure of any of the above-listed metal or an alloy thereof and a conductive oxide (e.g., Mg—Ag/ITO, etc.). The first electrode 172 and the second electrode 178 may be both formed by sputtering, CVD or the like.

As a result of performing the above-described steps, the light emitting element 170 is formed.

5. Second Passivation Film

Figure 16:
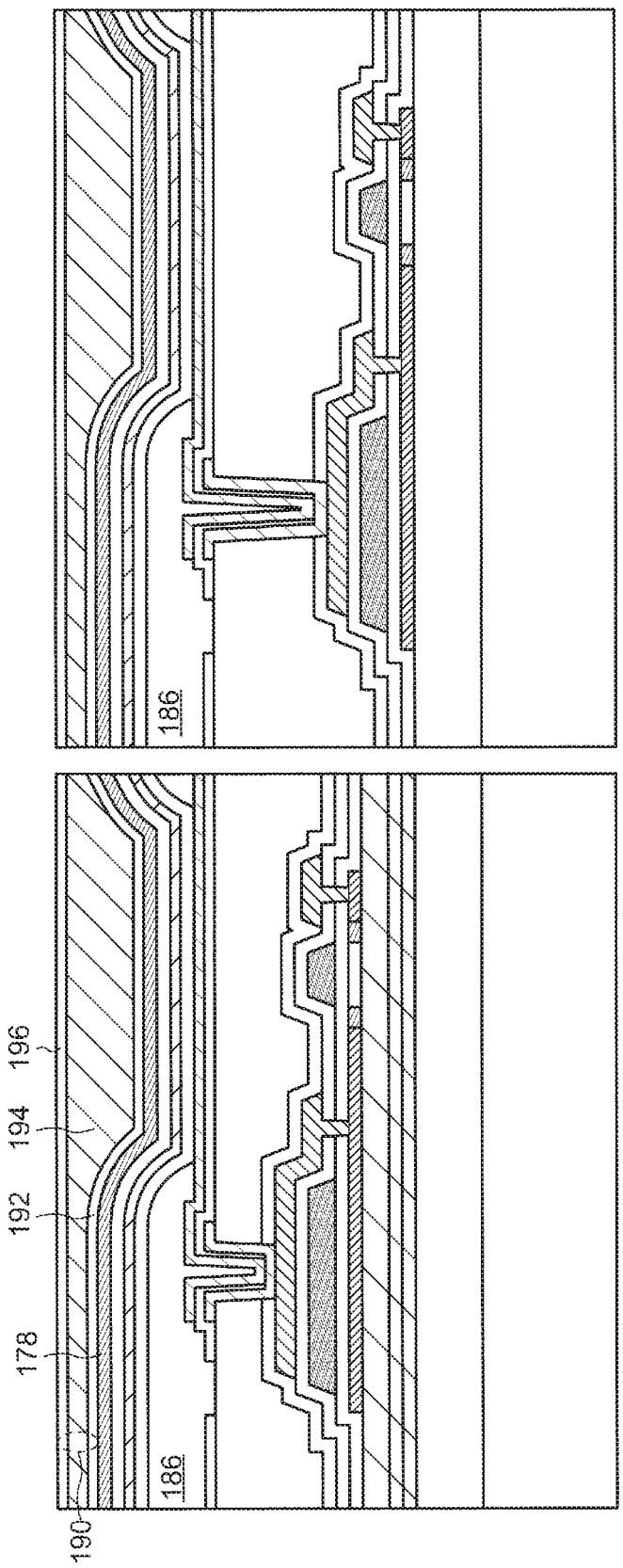
FIG. 16 is a schematic cross-sectional view showing a step of the method for producing the display device in an embodiment according to the present invention.

After the formation of the second electrode 178, the second passivation film 190 may be optionally formed. (FIG. 16). One of functions of the second passivation film 190 is to prevent entrance of moisture to the light emitting element 170 from outside. It is preferable that the second passivation film 190 has a high level of gas barrier property. The second passivation film 190 may have any structure, and may have a three-layer structure (a first layer 192, a second layer 194, and a third layer 196) as shown in FIG. 16.

The first layer 192 may contain an inorganic material such as, for example, silicon nitride, silicon oxide, silicon nitride oxide, silicon oxide nitride or the like, and may be formed by CVD, sputtering or the like.

Next, the second layer 194 is formed. The second layer 194 may contain an organic material such as an acrylic resin, a polysiloxane, a polyimide, a polyester or the like. As shown in FIG. 16, the second layer 194 may be formed to have a thickness so as to absorb the ruggedness caused by the partitioning wall 186 and thus provide a flat surface. The second layer 194 may be formed by a wet film formation method such as ink-jetting or the like. Alternatively, the second layer 194 may be formed by gasiform or atomizing oligomers, which are a material of the above-described polymers, under a reduced pressure, spraying the oligomers to the first layer 192, and then polymerizing the oligomers.

Then, the third layer 196 is formed. The third layer 196 may contain a material usable for the first layer 192, and may be formed by the same method as that of the first layer 192.

6. Peeling Step

Figure 17:
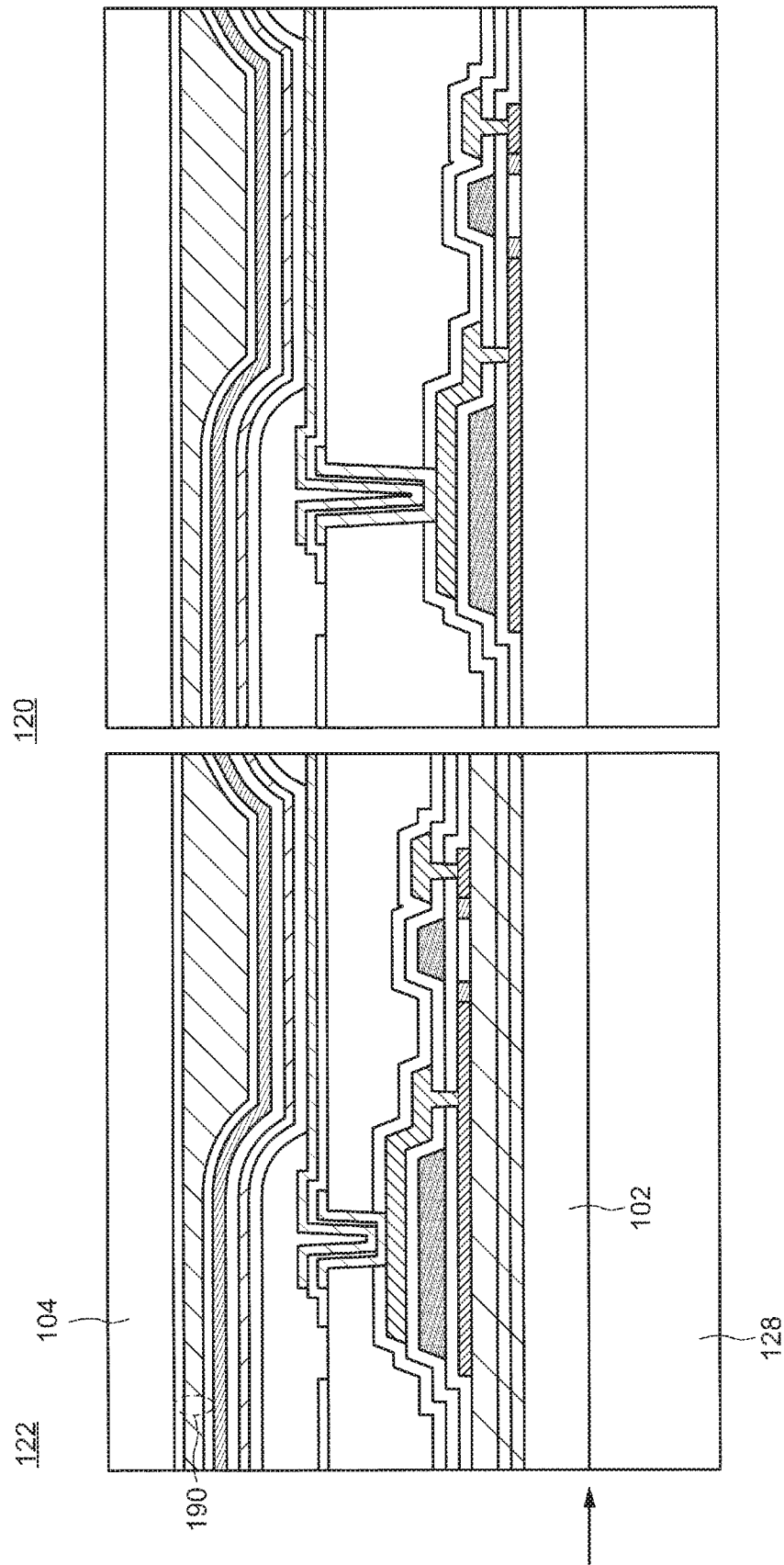
FIG. 17 is a schematic cross-sectional view showing a step of the method for producing the display device in an embodiment according to the present invention.

Then, as shown in FIG. 17, the counter substrate 104 is formed on the light emitting element 170 or the second passivation film 190. Although not shown, the counter substrate 104 may be bonded to the light emitting element 170 or the second passivation film 190 with an adhesive layer. The counter substrate 104 may contain a polymer material like the substrate 102.

Then, light such as laser light or the like is applied to decrease the adhesive force between the support substrate 128 and the substrate 102. Next, a physical force is used to peel the support substrate 128 at the interface between the support substrate 128 and the substrate 102 (represented by the arrow in FIG. 17).

As a result of performing the above-described steps, the display device 100 is produced.

Embodiment 4

In this embodiment, a display device 300 having a different structure from those in embodiment 1 and embodiment 2 will be described. Components the same as or similar to those in embodiments 1 and 2 may not be described.

Similar to the display device 100 in embodiment 1, the substrate 102 of the display device 300 includes the first region 120 and the second regions 122, and the underlying film 116 is provided on the second regions 122. The second regions 122 overlap a plurality of pixels 106. The plurality of pixels 106 overlapping the second regions 122 are arrayed in a matrix. Unlike in the display device 100, in the display device 300, the underlying film 116 is provided on a part of the first region 120. On the first region 120, a plurality of the underlying film 116 are arrayed in stripes, and the underlying films 116 each have a width smaller than the width or the length of each pixel 106. Therefore, in the display device 300, the underlying films 116 provided on the first region 120 overlap a plurality of pixels 106, but the plurality of pixels 106 are not arrayed in a matrix.

Figure 18:
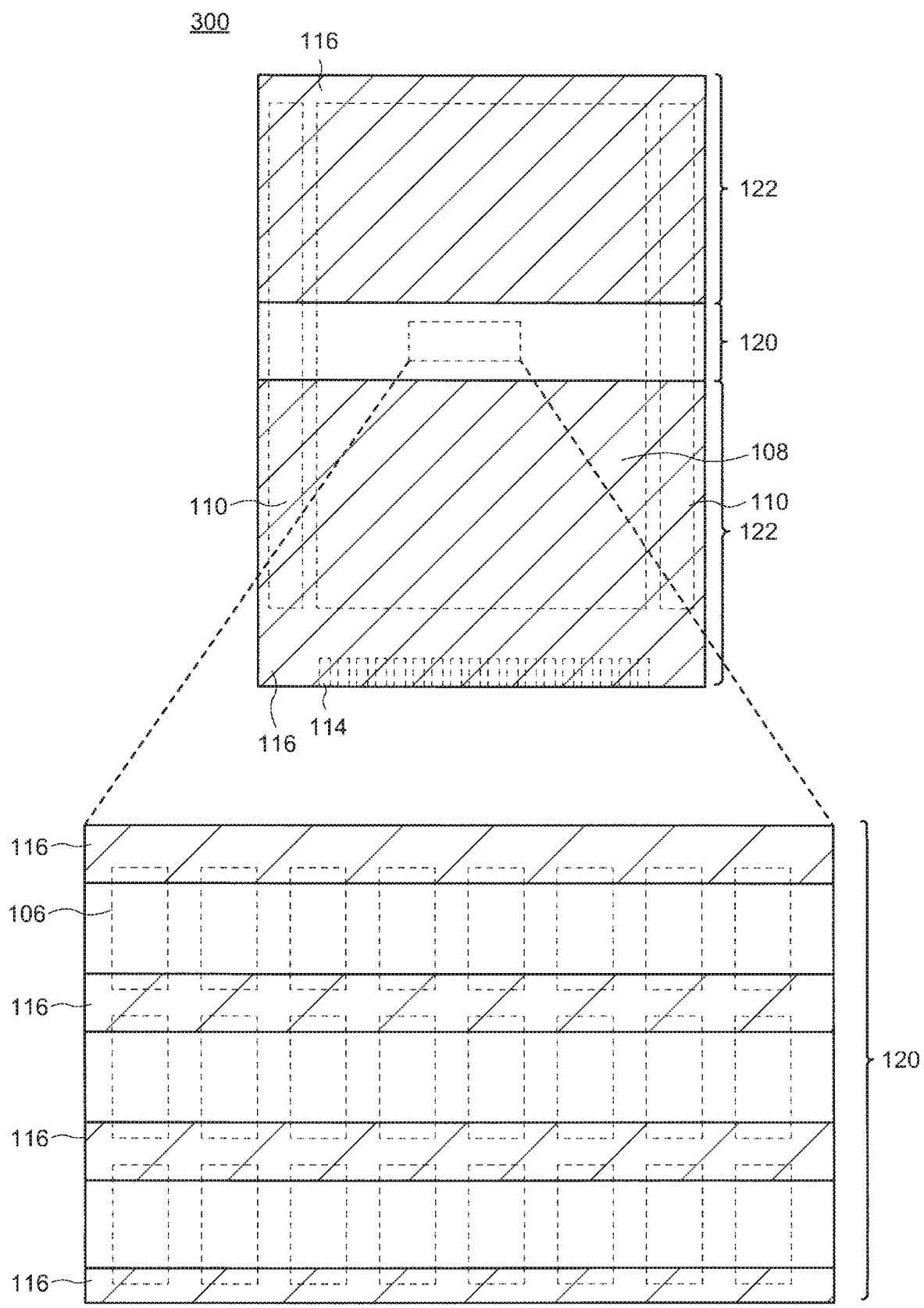
FIG. 18 is a schematic plan view of a display device in an embodiment according to the present invention.

FIG. 18 shows a specific structure of the display device 300. FIG. 18 shows the substrate 102 and the underlying films 116 provided on the substrate 102. The regions where the display region 108 and the scanning line driving circuits 110 are provided are represented by dashed lines. As shown in FIG. 18, the substrate 102 includes the first region 120 and the second regions 122 having the first region 120 therebetween. On a part of the first region 120, the underlying films 116 are provided. For example, as shown in the enlarged view in FIG. 18, the striped underlying films 116 are provided on the first region 120. On the first region 120, the striped underlying films 116 are located parallel to the column direction of the pixels 106. On the first region 120, the pixels 106 overlapping each underlying film 116 are not arrayed in a matrix but are arrayed in a straight line.

Figure 19:
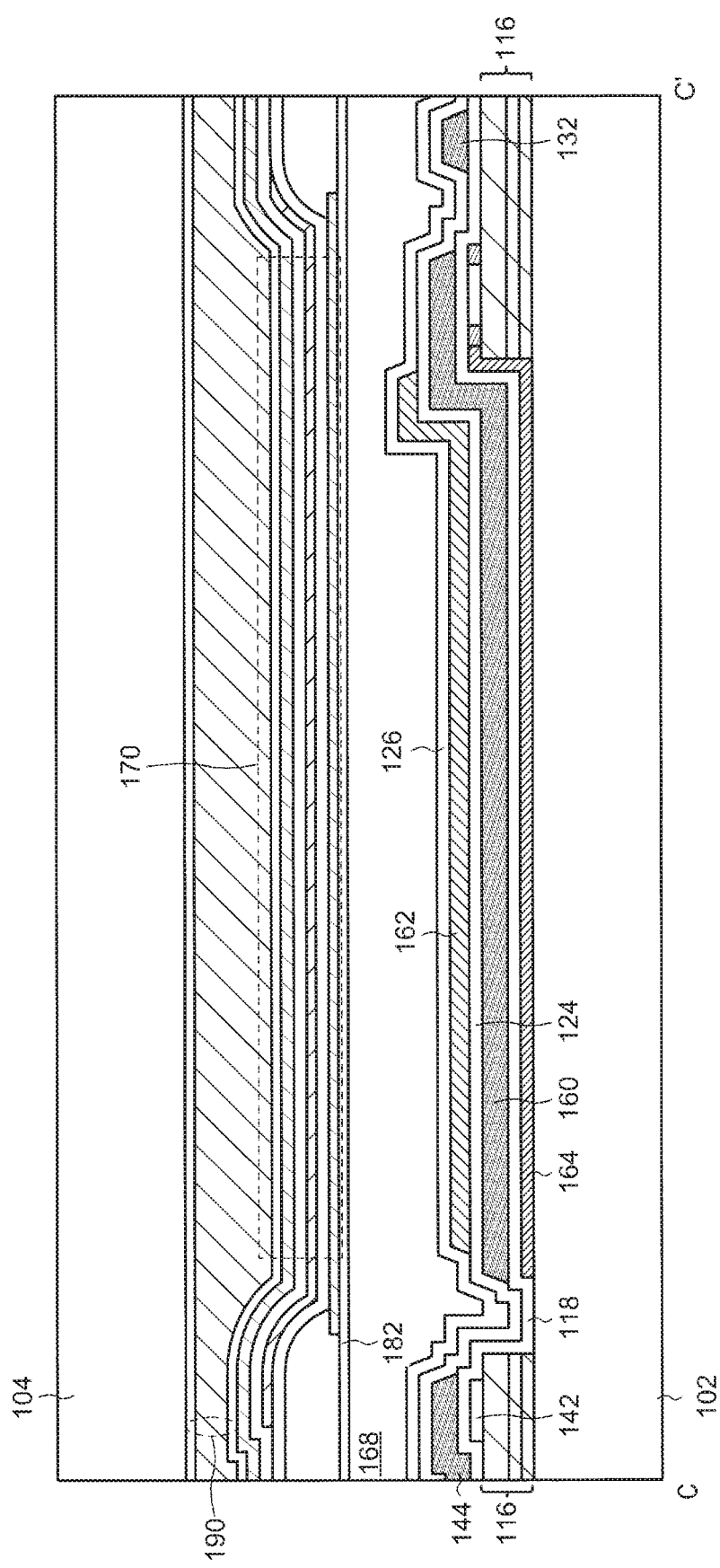
FIG. 19 is a schematic cross-sectional view of the display device in an embodiment according to the present invention.

FIG. 19 shows an example of a cross-sectional structure of one pixel 106. FIG. 19 is a schematic cross-sectional view corresponding to a cross-section taken along a chain line C-C' in FIG. 5. FIG. 19 shows a cross-section of the pixel 106 on the first region 120. As shown in FIG. 19, the underlying films 116 are selectively provided in a region overlapping the gate line 132 and the gate 144 of the transistor 140. By contrast, for example, in a region overlapping the second capacitor 162, no underlying film 116 is provided, and the semiconductor film 164 is in contact with the substrate 102. As shown in FIG. 19, the underlying films 116 may be provided between the substrate 102 and a region of the semiconductor film 142 or 164 that acts as a channel region of the transistor 140 or 150.

Flexibility of substrate 102 is low in the region where the underlying films 116 are provided. By contrast, the substrate 102 is highly flexible and easily deformable in the region where no underlying film 116 is provided. Therefore, when being deformed, the display device 300 is preferentially deformed in the region where no underlying film 116 is provided. Therefore, even though the display device 300 is bent in the first region 120, no significant load is applied to the underlying films 116. Thus, the underlying films 116 are suppressed from being cracked. As a result, breakage and disconnection of the underlying films 116 and also of the gate line 132 formed on the underlying films 116 are prevented. Therefore, the display device 300 in this embodiment is highly reliable and flexible.

Embodiment 5

In this embodiment, display devices 400 and 410 having different structures from those in embodiments 1, 2 and 4 will be described. Components the same as or similar to those in embodiments 1, 2 and 4 may not be described.

Figure 20A:
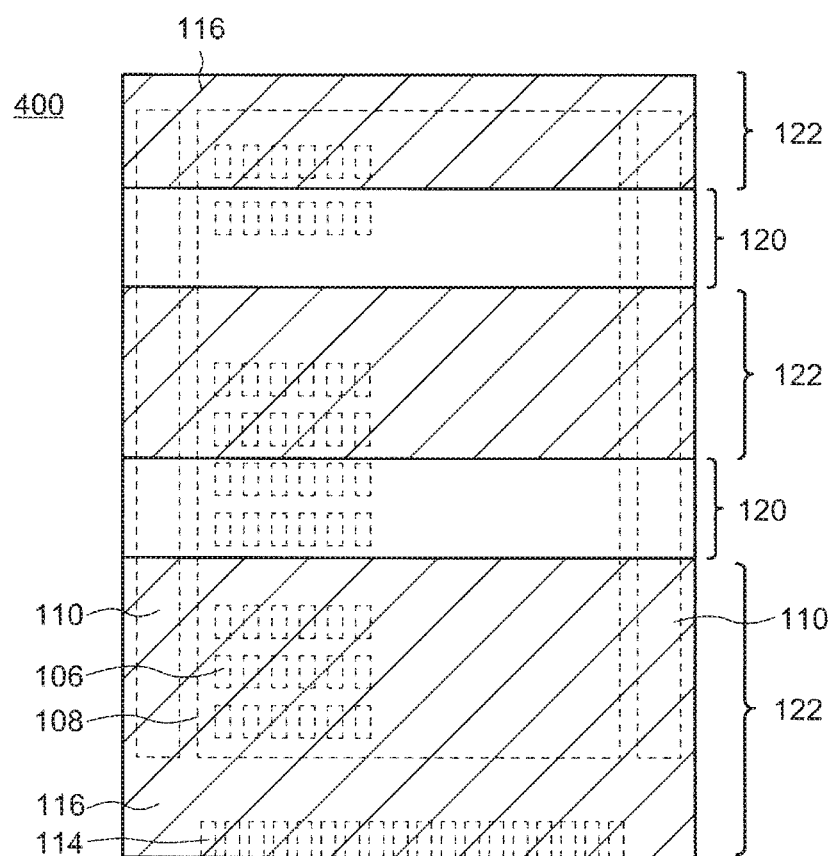
FIG. 20A is schematic plan view of a display device in an embodiment according to the present invention.

FIG. 20A is a plan view of the display device 400. FIG. 20A shows the substrate 102 and the underlying film 116 provided on the substrate 102. The regions where the display region 108 and the scanning line driving circuits 110 are provided are represented by dashed lines. As shown in FIG. 20A, the substrate 102 of the display device 400 includes a plurality of first regions 120 unlike the display devices 100, 200 and 300. The number of the second regions 122 may be larger than the number of the first regions 120. The first regions 120 are each sandwiched between the second regions 122. In the example of FIG. 20A, there are two first regions 120. Alternatively, three or more first regions 120 may be provided. Since the plurality of first regions 120 are provided, the display device 400 may be bent or folded at a plurality of positions.

Figure 20B:
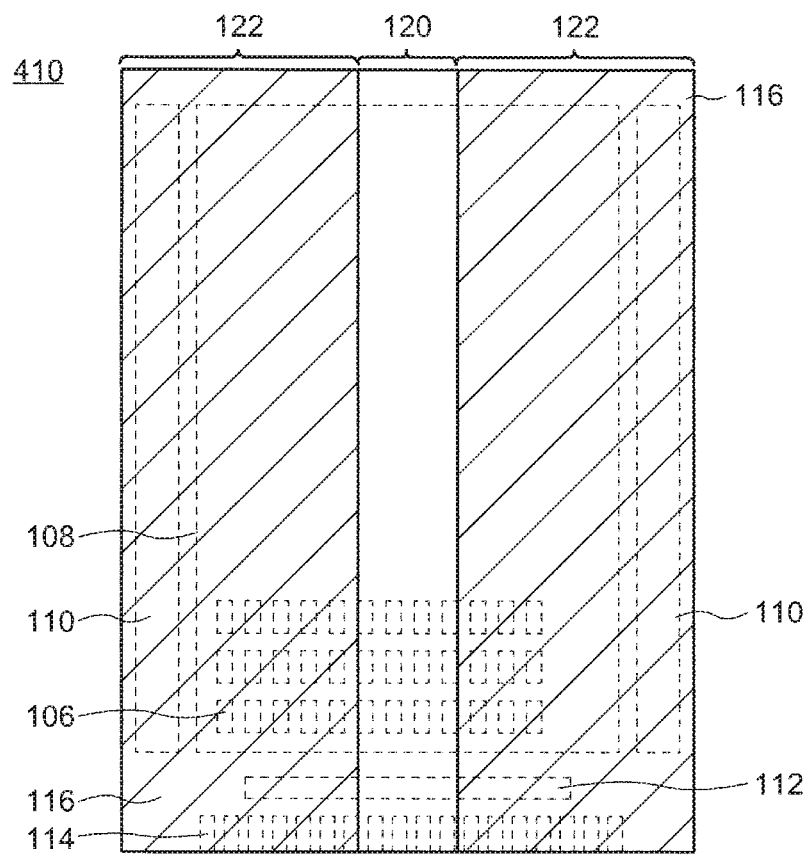
FIG. 20B is schematic plan view of a display device in an embodiment according to the present invention.

FIG. 20B is a schematic plan view of the display device 410. Similar to FIG. 20A, FIG. 20B shows the substrate 102 and the underlying film 116 provided on the substrate 102. The regions where the display region 108 and the scanning line driving circuits 110 are provided are represented by dashed lines. Unlike in the display device 100, 200 and 300, in the display device 410, the first region 120 is provided in strips parallel to the longer side of the display region 108. In this case, the first region 120 may overlap the data line driving circuit 112 or the terminals 114. With such a structure, the display device 410 may be bent and deformed in a direction parallel to the shorter side so that ends of the display device 410 in the shorter side face each other.

Embodiment 6

In this embodiment, display devices 500, 510 and 520 having structures different from those in embodiments 1, 2, 4 and 5 will be described. Components the same as or similar to those in embodiments 1, 2, 4 and 5 may not be described.

Unlike in the display devices 100, 200, 300, 400 and 410, in the display device 500, a plurality of the display regions 108 are provided on the substrate 102, the plurality of display regions 108 are selectively provided on the second regions 122, and the first region 120 is provided between the plurality of display regions 108.

Figure 21:
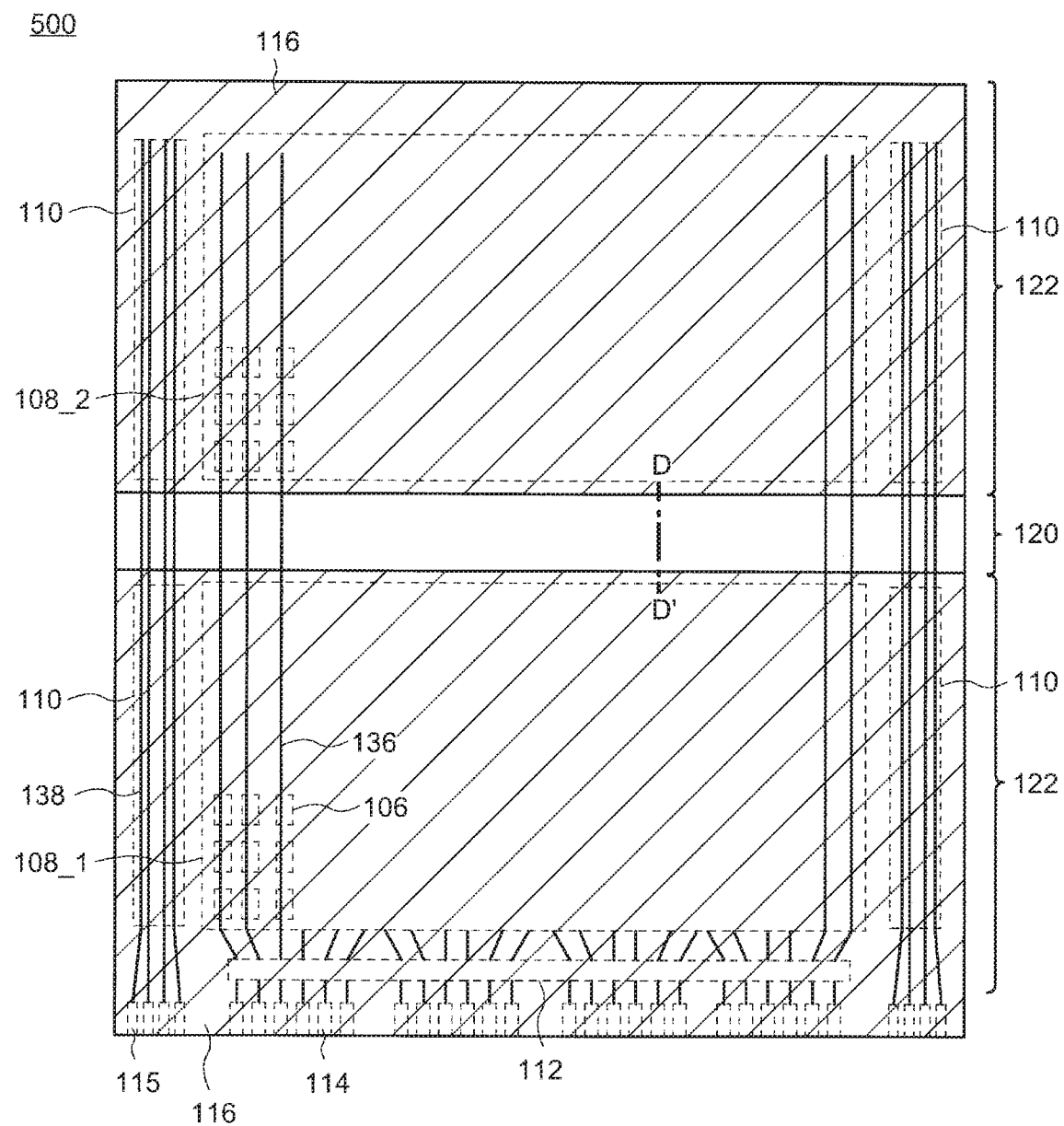
FIG. 21 is schematic plan view of a display device in an embodiment according to the present invention.

FIG. 21 is a schematic plan view of the substrate 102 and the underlying film 116 provided on the substrate 102 in the display device 500. In FIG. 21, the regions where the display region 108, the scanning line driving circuits 110 and the like are provided are represented by dashed lines. As shown in FIG. 21, the substrate 102 of the display device 500 includes the plurality of (two in FIG. 21) second regions 122, on which the underlying film 166 is provided. The substrate 102 further includes the first region 120 between the two second regions 122. On the two second regions 122, display regions 108_1 and 108_2 are provided respectively. The display regions 108_1 and 108_2 each include a plurality of pixels 106. The pixels 106 do not overlap the first region 120. The display regions 108_1 and 108_2 may be independently driven by the scanning line driving circuits 110 or the like, and may reproduce different images from each other. The display regions 108_1 and 108_2 may have similar shapes to each other, or may have different shapes or area sizes from each other.

Wirings 136 extend from the terminals 144 to the pixels 106 via the data line driving circuit 112. By contrast, wirings 138 extend from terminals 115 to the scanning line driving circuits 110. The wirings 136 act as, for example, the data lines 130 or the current supply lines 134. The wirings 136 are electrically connected with the pixels 106 in the display region 108_1 closer to the terminals 114, and further cross the first region 120 and are electrically connected with the pixels 106 in the display region 108_2 farther from the terminals 114. Similarly, the wirings 138 are electrically connected with the scanning line driving circuits 110 closer to the terminal 115, and further cross the first region 120 and are electrically connected with the scanning line driving circuits 110 farther from the terminal 115. Therefore, a connector merely needs to be connected with one side of the display device 500 to drive both of two display regions 108_1 and 108_2.

Figure 25:
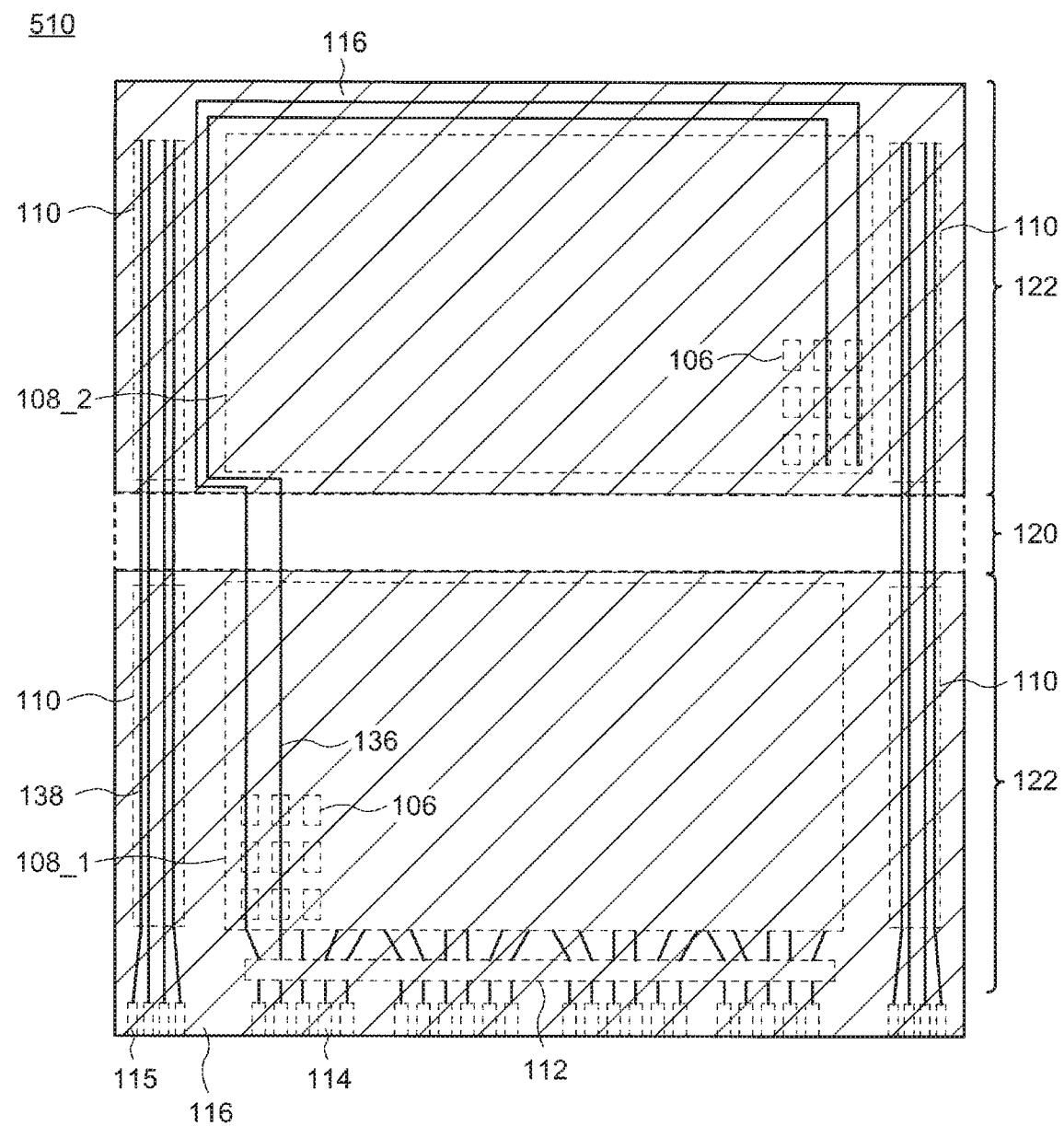
FIG. 25 is a schematic plan view of a display device in an embodiment according to the present invention.

The wirings 136 and 138 are not limited to being arranged in the layout shown in FIG. 21. For example, as in a display device 510 shown in FIG. 25, the wirings 136 may be located such that a part of or all of the wirings 136 extend from the terminals 114, cross the display region 180_1 and a region overlapping the first region 120, extend between the display region 180_2 and the scanning line driving circuits 110 farther from the display region 180_1, and are connected with the display region 180_2. In this case, in the display region 108_1, the pixels 106 are sequentially connected with the wirings 136 from the pixel closest to the terminals 114. By contrast, in the display region 108_2, the pixels 106 are sequentially connected with the wirings 136 from the pixel farthest from the terminals 114.

Figure 26:
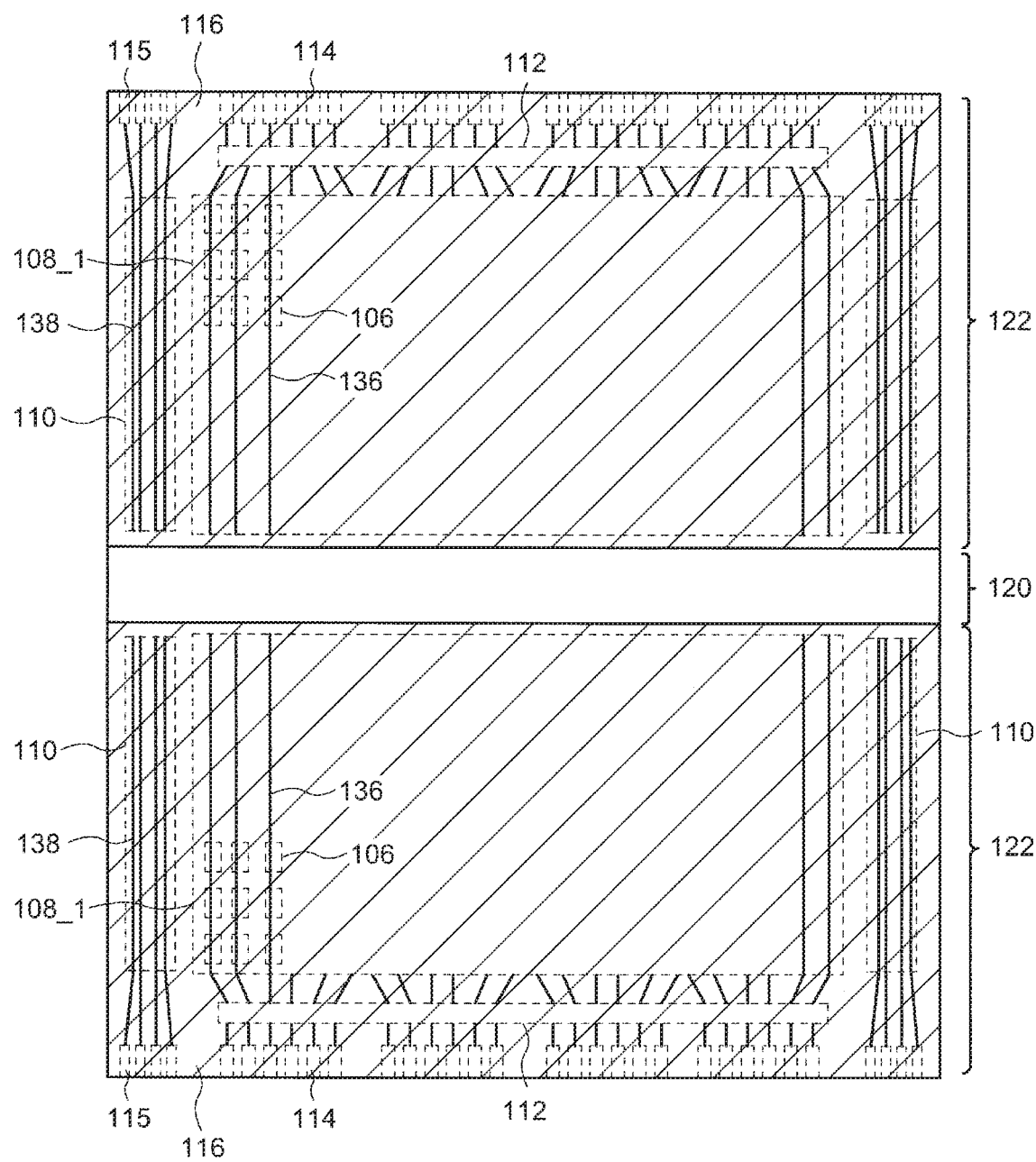
FIG. 26 is a schematic plan view of a display device in an embodiment according to the present invention.

Alternatively, as shown in FIG. 26, the terminals 114 and 115 connectable with the connector may be located along two sides of the substrate 102, so that neither the wirings 136 nor the wirings 138 are located on the first region 120. In a display device 520 having such a layout, the terminals 114 and 115 are located along two sides of the substrate 102 facing each other. The wirings 136 and 138 supplying signals to the display region 108_1 and the scanning line driving circuits 110 driving the display region 108_1 extend from the terminals 114 and 115 located in the vicinity of the side of the display region 108_1 that is opposite to the first region 120. By contrast, the wirings 136 and 138 supplying signals to the display region 108_2 and the scanning line driving circuits 110 driving the display region 108_2 extend from the terminals 114 and 115 located in the vicinity of the side of the display region 108_2 that is opposite to the first region 120. With such a structure, the first region 120 is more easily deformable.

FIG. 22 shows a cross-sectional structure of the display device 500. FIG. 22 is a cross-sectional view taken along a chain line D-D' in FIG. 21. As shown in FIG. 22, for example, the data line 130 extends from the display region 108_1 to the display region 108_2. Although not shown, the current supply line 134 also extends from the display region 108_1 to the display region 108_2 on the interlayer information film 124.

The first region 120 of the substrate 102 is in contact with the gate insulating film 118. By contrast, the second regions 122 of the substrate 102 are in contact with the underlying film 116. Although not shown, on the first region 120, the underlying film 116 having a smaller thickness than on the second regions 122 may be provided, similar to in the display device 200 in embodiment 2. In this case, on the first region 120, the gate insulating film 118 is in contact with the underlying film 116 having such a smaller thickness.

Figure 23A:
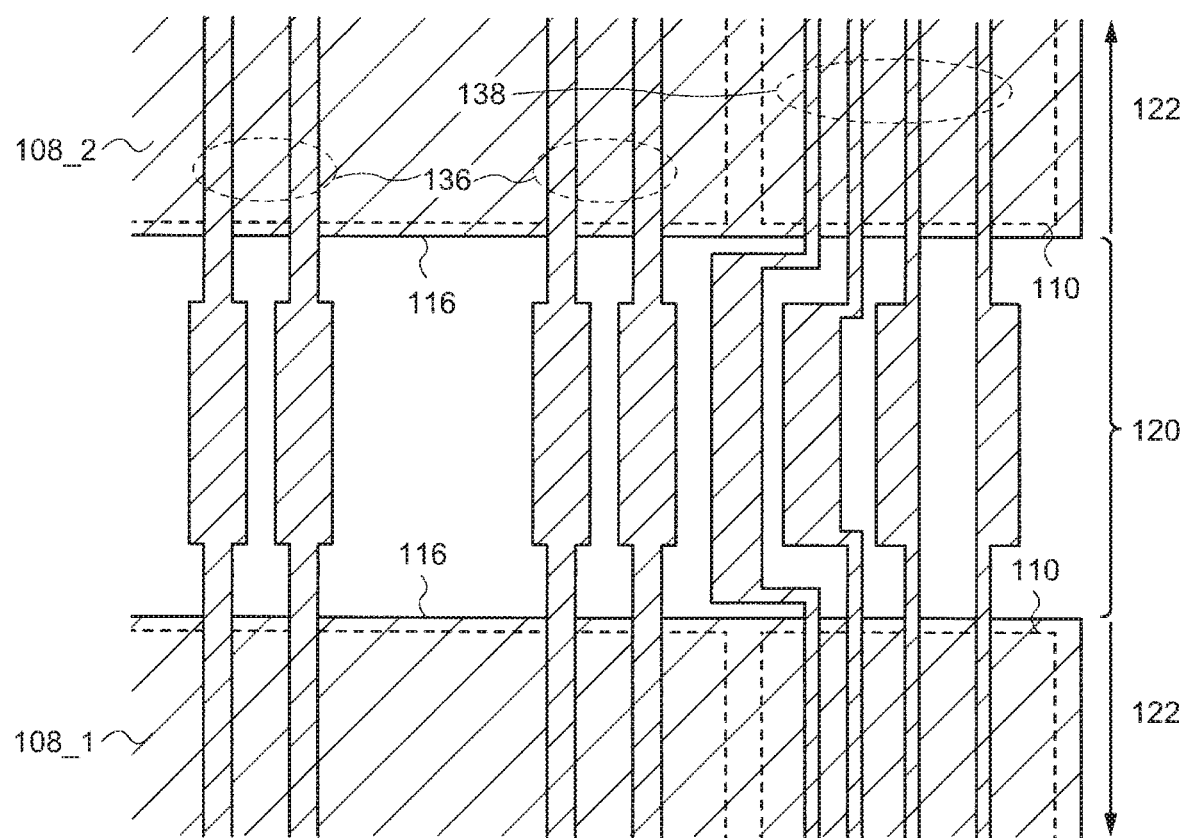
FIG. 23A is a plan view of wirings in the display device in an embodiment according to the present invention.

The first region 120 with no underlying film 116 is more flexible than the second regions 122. Therefore, the first region 120 is more easily bendable than the second regions 122. The display device 500 may be structured such that the wirings 136 and 138 are wider on the first region 120 than on the second region 122. For example, as shown in FIG. 23A, the wirings 136 and the wirings 138 may be wider on the first region 120 than on the second region 122.

In this case, on the first region 120, the wirings 136 and the wirings 138 (the wirings 136 in FIG. 23A) may have a symmetrical configuration with respect to a straight line that is parallel to a direction in which the wirings 136 and 138 extend and passes the center of each of the wirings 136 and the wirings 138.

Figure 23B:
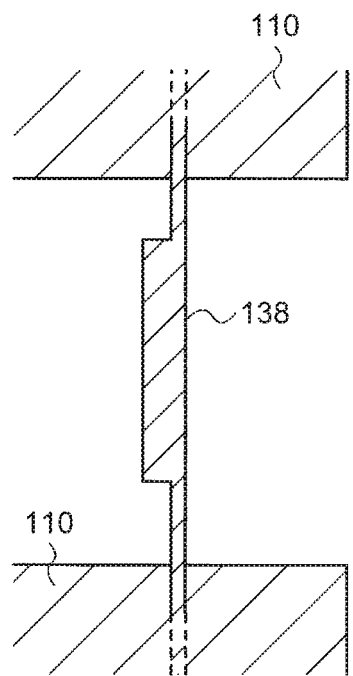
FIG. 23B is a plan view of wirings in the display device in an embodiment according to the present invention.
Figure 23C:
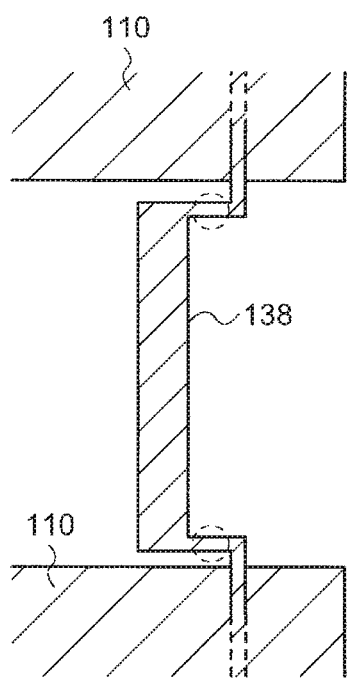
FIG. 23C is a plan view of wirings in the display device in an embodiment according to the present invention.

Alternatively, as shown in FIG. 23B, the wirings 136 and the wirings 138 (only one wiring 138 is shown in FIG. 23B) may be shaped such that a straight line that is parallel to the direction in which the wirings 136 and 138 extend and passes the center of the wider portion of each of the wirings 136 and the wirings 138 does not pass the thinner portion thereof. In this case, as shown in FIG. 23C, the wirings 136 and the wirings 138 (only one wiring 138 is shown in FIG. 23C) may each include straight portions (in the circles in FIG. 23C) having a vector perpendicular to the direction in which the wirings 136 and 138 extend, the straight portion being between the wider portion and the thinner portion.

Figure 24:
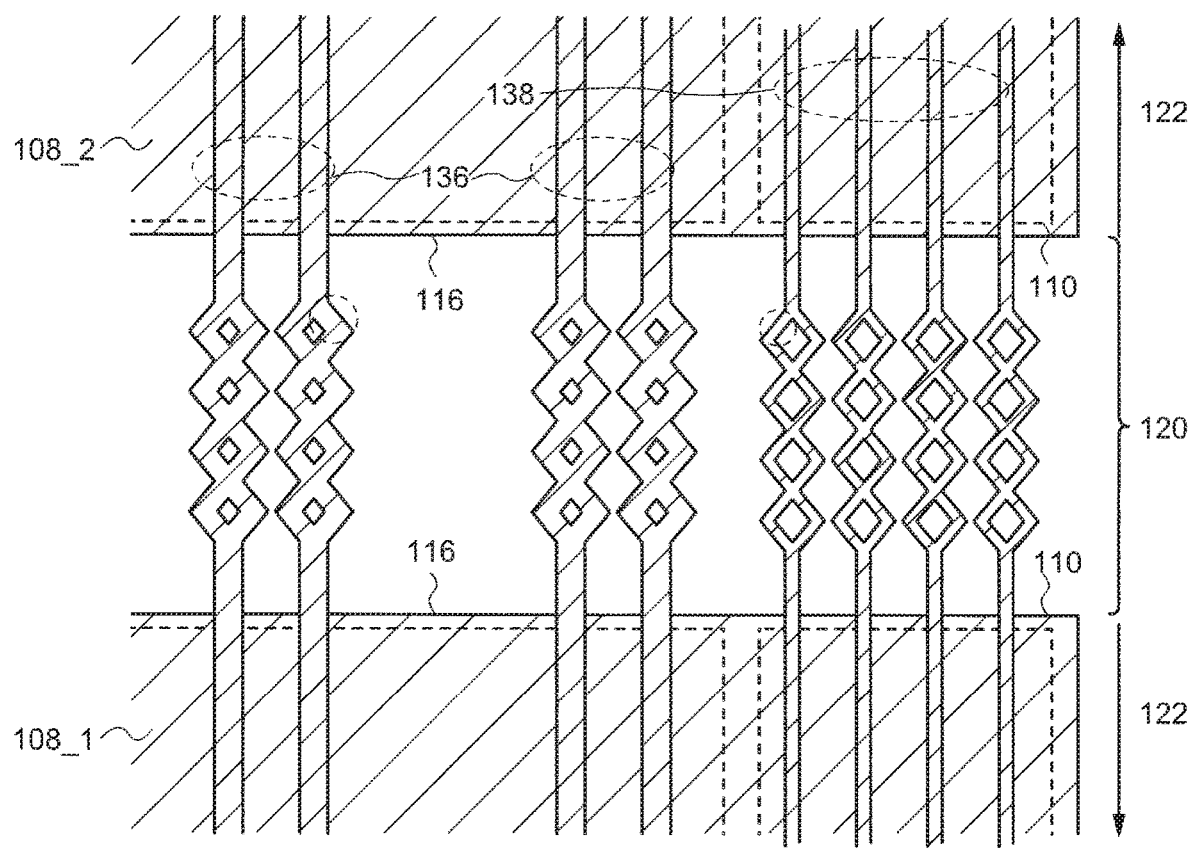
FIG. 24 is a plan view of wirings in the display device in an embodiment according to the present invention.

Still alternatively, as shown in FIG. 24, the wirings 136 and the wirings 138 may be structured to be partially wider as described above and also to include straight portions (in the circles in FIG. 24) having a vector oblique to the direction in which the wirings 136 and 138 extend. Such a structure improves the durability against bending or folding, and prevents the wirings 136 and 138 from being broken or disconnected.

In each of the display devices 500, 510 and 520, the underlying film 116 is not provided on the first region 120, which is bent when the display device 500, 510 or 520 is deformed. Alternatively, the underlying film 116 is provided with a smaller thickness on the first region 120. Therefore, even though the display devices 500, 510 and 520 are each deformed in the first region 120, breakage or disconnection of the wirings or the electrodes is prevented from being caused by the cracks in the underlying line 116, and thus the breakage of the display device is prevented. Therefore, the display devices 500, 510 and 520 in this embodiment are highly reliable and flexible.

The above-described embodiments and modifications according to the present invention may be appropriately combined as long as no contradiction occurs. Devices described above in embodiments according to the present invention may have an element added thereto, or deleted therefrom, or may be changed in design optionally by a person of ordinary skill in the art. Methods described above in embodiments according to the present invention may have a step added thereto, or deleted therefrom, or may be changed in a condition optionally by a person of ordinary skill in the art. Such devices and methods are encompassed in the scope of the present invention as long as including the gist of the present invention.

In this specification, an EL display device is disclosed as an example. The embodiments of the present invention are also applicable to, for example, a self-light emitting display device other than the EL display device, a liquid crystal display device, an electronic paper-type display device including an electrophoretic element or the like, or any other flat panel display device. The embodiments of the present invention are applicable to small-, medium-, large-size display devices with no specific limitation.

Even functions and effects that are different from those provided by the above-described embodiments but are obvious from the description of this specification or are easily expectable by a person of ordinary skill in the art are naturally construed as being provided by the present invention.

What is claimed is:
1. A display device comprising:
 a base film including a first region and a plurality of second regions having the first region therebetween;
 an inorganic insulating film on the base film, the inorganic insulating film being in contact with the plurality of second regions of the base film;
 a plurality of first pixels overlapping the first region; and
 a plurality of second pixels overlapping the plurality of second regions with the inorganic insulating film being between the plurality of second pixels and the plurality of second regions, wherein
the inorganic insulating film is divided by the first region and is discontinuous between the plurality of second regions, and
the first region of the base film is configured to be bent.

2. The display device according to claim 1, wherein
the plurality of first pixels and the plurality of second pixels each include:
a semiconductor film and a gate electrode overlapping each other; and
a gate insulating film between the semiconductor film and the gate electrode, and
the inorganic insulating film is between the base film and the gate insulating film in the plurality of second regions.

3. The display device according to claim 1, wherein the base film is flexible.

4. The display device according to claim 1, wherein the base film contains a polyimide.

5. The display device according to claim 2, wherein the gate insulating film is in direct contact with the base film in the first region.

6. The display device according to claim 1, further comprising a wiring extending from one of the plurality of second regions to the first region, wherein
on the first region, the wiring includes a portion wider than a portion of the wiring on the second region.

7. The display device according to claim 1, further comprising a wiring extending from one of the plurality of second regions to the first region, wherein
the wiring includes:
a first portion extending in a first direction;
a second portion extending in a second direction from an end of the first portion, the second direction being different from the first direction; and
a third portion extending in the first direction from an end of the second portion opposite to the first portion, and
at least a part of the first portion is on one of the plurality of second regions, and the third portion is on the first region.

8. A display device comprising:
a base film having a first display region including a plurality of first pixels, a second display region including a plurality of second pixels, and a first region between the first display region and the second display region; and
an inorganic insulating film overlapping the base film in the first display region and the second display region, wherein
the first region of the base film is exposed from the inorganic insulating film, and
the first region of the base film is configured to be bent.

9. The display device according to claim 8, wherein
the plurality of first pixels and the plurality of second pixels each include:
a semiconductor film and a gate electrode overlapping each other; and
a gate insulating film between the semiconductor film and the gate electrode, and
the gate insulating film is shared by the plurality of first pixels and the plurality of second pixels and is in contact with the base film in the first region.

10. The display device according to claim 8, wherein the base film is flexible.

11. The display device according to claim 8, further comprising a wiring extending from the first display region to the first region, wherein
in the first region, the wiring includes a portion wider than in a portion of the wiring on the first display region.

12. The display device according to claim 8, wherein
the base film has a first side extending in the first display region, the first region and the second display region, and a second side facing the first side;
the first region is continuous from the first side to the second side; and
the wiring is not in the first region.

* * * * *